US010402510B2

(12) United States Patent
Kuwamura

(10) Patent No.: US 10,402,510 B2
(45) Date of Patent: Sep. 3, 2019

(54) CALCULATING DEVICE, CALCULATION METHOD, AND CALCULATION PROGRAM

(71) Applicant: FUJITSU LIMITED, Kawasaki-shi, Kanagawa (JP)

(72) Inventor: Shinya Kuwamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1018 days.

(21) Appl. No.: 14/800,277

(22) Filed: Jul. 15, 2015

(65) Prior Publication Data

US 2016/0026741 A1 Jan. 28, 2016

(30) Foreign Application Priority Data

Jul. 23, 2014 (JP) ................................ 2014-150157
Dec. 9, 2014 (JP) ................................ 2014-248968

(51) Int. Cl.
*G06F 17/50* (2006.01)

(52) U.S. Cl.
CPC ................................ *G06F 17/5009* (2013.01)

(58) Field of Classification Search
CPC .................................................. G06F 17/5009
USPC .............................................................. 703/2
See application file for complete search history.

(56) References Cited

U.S. PATENT DOCUMENTS 8,457,943 B2 * 6/2013 Wang ...................... G06F 9/455 703/14
2004/0210721 A1 * 10/2004 Detjens ................. G06F 11/261 711/141
2006/0167667 A1 * 7/2006 Maturana ............... G05B 17/02 703/6
2007/0233451 A1 10/2007 Tatsuoka et al.
2013/0096903 A1 4/2013 Kuwamura et al.
2013/0103373 A1 * 4/2013 Benayon .............. G06Q 10/067 703/6
2013/0207983 A1 * 8/2013 Ro ........................ G06F 9/5027 345/505

FOREIGN PATENT DOCUMENTS

| | | | |
|---|---|---|---|
| JP | 5-88912 | | 4/1993 |
| JP | 8-339388 | | 12/1996 |
| JP | 2002-288003 | | 10/2002 |
| JP | 2007-207158 | | 8/2007 |
| JP | 2011-203803 | | 10/2011 |
| JP | 2013-84178 | | 5/2013 |
| JP | 2011-203803 | * | 10/2013 |

* cited by examiner

*Primary Examiner* — Brian S Cook
(74) *Attorney, Agent, or Firm* — Staas & Halsey LLP

(57) ABSTRACT

A calculating device including; a controller configured to execute, for a multicore processor, a first calculation process of calculating a first performance value of a first code executed by the first core and including a first access instruction by executing a first simulation, a second calculation process of calculating a second performance value of a second code executed by the second core and including a second access instruction by executing a second simulation, a synchronization process of synchronizing the first and the second simulations when the first access instruction is executed in the first simulation, and a correction process of correcting the first performance value, by executing a third simulation to simulate an operation of the cache memory when the first core accesses the main memory through the cache memory in accordance with the first access instruction, after the synchronization by the synchronization process.

10 Claims, 21 Drawing Sheets

600

| FIRST CORE TIME | FIRST CORE ADDRESS | SECOND CORE TIME | SECOND CORE ADDRESS |
|---|---|---|---|
| 100 | 8020 | 115 | 8020 |
| 110 | 8024 | | |
| 120 | 8028 | | |

FIG. 9

```
cache_ld(address, rep_delay, pre_delay){
        avail_delay = 0;
        if(pre_delay < current_time – preld_time)
                avail_delay = pre_delay – current_time + preld_time;
        cache_lookup( address );
        if(cache_hit){
                cache_update_onhit(address );
        } else {
                cache_update_onmiss(address );
                avail_delay += cache_miss_latency
                if(rep_delay < avail_delay)
                        avail_delay –= avail_delay – rep_delay;
        }
        preld_time = current_time;
}
```

1600

| CORE | SHARING |
|---|---|
| 1 | NONE |
| 2 | 3, 4 |
| 3 | 2, 4 |
| 4 | 2, 3 |

CALCULATING DEVICE, CALCULATION METHOD, AND CALCULATION PROGRAM

CROSS-REFERENCE TO RELATED APPLICATIONS

This application is based upon and claims the benefit of priority of the prior Japanese Patent Application No. 2014-248968, filed on Dec. 9, 2014, and the benefit of priority of the prior Japanese Patent Application No. 2014-150157, filed on Jul. 23, 2014, the entire contents of which are incorporated herein by reference.

FIELD

The embodiments discussed herein are related to a calculating device, a calculation method, and a calculation program.

BACKGROUND

Traditionally, in order to support the development of a program, there has been a technique for estimating a performance value such as an execution time of the program when the program is executed on a processor. For example, an actual host processor converts a code executable by a processor to be evaluated into a code executable by the host processor. Then, the host processor executes the code after the conversion and thereby simulates an operation when the processor to be evaluated executes the code. By simulating the operation, the host processor estimates a performance value of the code. For example, when an instruction to access a main memory, such as a load instruction or a store instruction, is executed, the processor to be evaluated accesses the main memory through a cache memory and thus a performance value varies depending on whether the access to the cache memory causes a cache miss or a cache hit. Traditionally, the cache miss or the cache hit is treated as a prediction result, and a performance value for the prediction result is treated as a performance value of the access instruction. There is a technique for correcting, when the host processor executes the access instruction after conversion, the performance value of the access instruction by simulating an operation of the modeled cache memory, based on whether the result of the execution is different from the prediction result (refer to, for example, Japanese Laid-open Patent Publication No. 2013-84178).

In addition, a cycle simulation that is executed to synchronize cycles of multiple execution blocks and simulate the execution blocks in parallel is known (refer to, for example, Japanese Laid-open Patent Publication No. 2007-207158). Furthermore, a technique for detecting a potential failure of programs to be executed in parallel when simulating operations of multiple central processing units (CPUs) and a hardware resource shared by the multiple CPUs is known (refer to, for example, Japanese Laid-open Patent Publication No. 2011-203803).

However, if a processor to be evaluated has multiple cores, a cache memory is shared by the cores, and destinations to be accessed in accordance with access instructions executed by the cores are the same or close to each other, a cache hit and a cache miss cause different results, depending on the order of the access. In this case, in the conventional techniques, a performance value is calculated for each of the cores, and the accuracy of calculating performance values of programs is reduced.

According to an aspect, an object of the disclosure is to provide a calculating device, a calculation method, and a calculation program that may improve the accuracy of calculating performance values of programs.

SUMMARY

According to an aspect of the invention, a calculating device includes; a controller configured to execute, for a multicore processor, a first calculation process of calculating a first performance value of a first code executed by the first core and including a first access instruction by executing a first simulation, a second calculation process of calculating a second performance value of a second code executed by the second core and including a second access instruction by executing a second simulation, a synchronization process of synchronizing the first and the second simulations when the first access instruction is executed in the first simulation, and a correction process of correcting the first performance value, by executing a third simulation to simulate an operation of the cache memory when the first core accesses the main memory through the cache memory in accordance with the first access instruction, after the synchronization by the synchronization process.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 9 is an explanatory diagram illustrating an example of functions included in a helper function for a ld instruction and to be used for a correction process;

DESCRIPTION OF EMBODIMENTS

Hereinafter, embodiments of a calculating device, a calculation method, and a calculation program that are disclosed herein are described in detail with reference to the accompanying drawings.

First Embodiment

Figure 1:
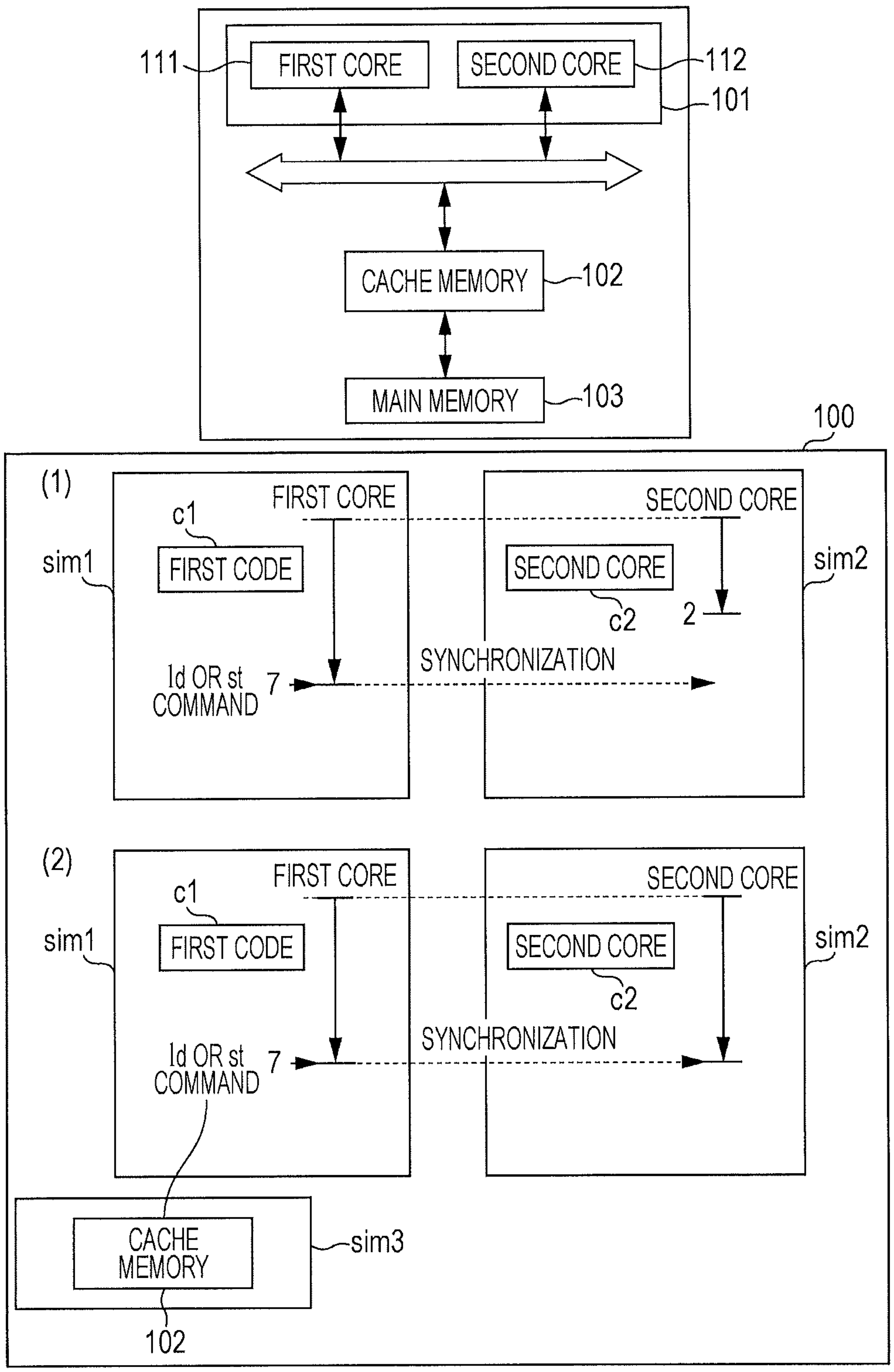
FIG. 1 is an explanatory diagram illustrating an example of operations of a calculating device according to a first embodiment.

FIG. 1 is an explanatory diagram illustrating an example of operations of a calculating device according to a first embodiment. A calculating device 100 is a computer configured to calculate, for a multicore processor 101, performance values of codes to be executed by first and second cores 111 and 112 that are included in the multicore processor 101 and able to access the same main memory 103 through the same cache memory 102.

The multicore processor 101 includes the first core 111 and the second core 112. The first core 111 and the second core 112 access the main memory 103 through the cache memory 102 shared by the first and second cores 111 and 112.

Traditionally, there has been the technique for simulating an operation of a target processor and thereby calculating performance values of codes when the target processor executes the codes, as described above. If the target processor is the multicore processor 101 and the cache memory 102 is shared by the cores, destinations to be accessed in accordance with access instructions may be the same or close to each other. In this case, a cache hit and a cache miss cause different results depending on which core first accesses a destination. Specifically, for example, if an access instruction is executed by the first core 111 or the second core 112, the cache memory 102 determines whether or not the cache memory 102 has, stored therein, details of a destination to be accessed in accordance with the access instruction. If the cache memory 102 has the details stored therein, the cache memory 102 updates or reads the stored details as a cache hit. If the cache memory 102 does not have the details, the cache memory 102 accesses the main memory 103 as a cache miss. Thus, a performance value of the access instruction that is obtained when the details are stored as the cache hit is different from a performance value of the access instruction that is obtained when the details are accessed as the cache miss. In the conventional technique, performance values of codes are calculated for cores, and thus the accuracy of the calculation of the performance values of the codes is reduced.

In the first embodiment, upon the execution of instructions to access the main memory in simulations of the execution of the codes by the cores, the calculating device 100 corrects performance values of the instructions based on the results of simulating the cache memory after the synchronization of the simulations of the cores. Thus, the accuracy of the calculation of the performance values may be improved.

In the first embodiment, for example, the target multicore processor 101 is an ARM (registered trademark) processor, and a host CPU included in the calculating device 100 is an Intel64 CPU. The multicore processor 101 has a symmetric multiprocessing (SMP) configuration for executing a single operating system (OS). For example, a performance value to be calculated is an execution time and the accuracy of a simulation is a clock cycle.

First, the calculating device 100 executes a first calculation process of calculating a first performance value of a first code c1 executed by the first core 111 by executing a first simulation sim1 to simulate an operation when the first core 111 executes the first code c1, as represented by (1) illustrated in FIG. 1. The first code c1 has a first access instruction to access the main memory 103. The first access instruction is, for example, a ld (load) instruction or a st (store) instruction. For example, the first code c1 is a block obtained by dividing a program. Details of the division of the program are the same as an example described in Japanese Laid-open Patent Publication No. 2013-84178.

The calculating device 100 executes a second calculation process of calculating a second performance value of a second code c2 executed by the second core 112 by executing a second simulation sim2 to simulate an operation when the second core 112 executes the second code c2. The second code c2 has a second access instruction to access the main memory 103. The second access instruction is, for example, a ld instruction or a st instruction. For example, the second code c2 is a block obtained by dividing the program.

When the first access instruction is executed in the first simulation sim1, the calculating device 100 executes a process of synchronizing the first simulation sim1 and the second simulation sim2 with each other.

As represented by (2) illustrated in FIG. 1, the calculating device 100 executes a process of correcting the first performance value calculated in the first calculation process after the synchronization process. The correction process is executed by executing a third simulation sim3 to simulate an operation of the cache memory 102 when the first core 111 accesses the main memory 103 through the cache memory 102 in accordance with the first access instruction.

In this manner, the accuracy of simulating the order in which access instructions are executed by the cores is improved by the process of synchronizing the first simulation sim1 with the second simulation sim2. Thus, since the accuracy of simulating cache hits and cache misses that occur in the cache memory 102 in response to access instructions is improved, the accuracy of the calculation may be improved.

Figure 2:
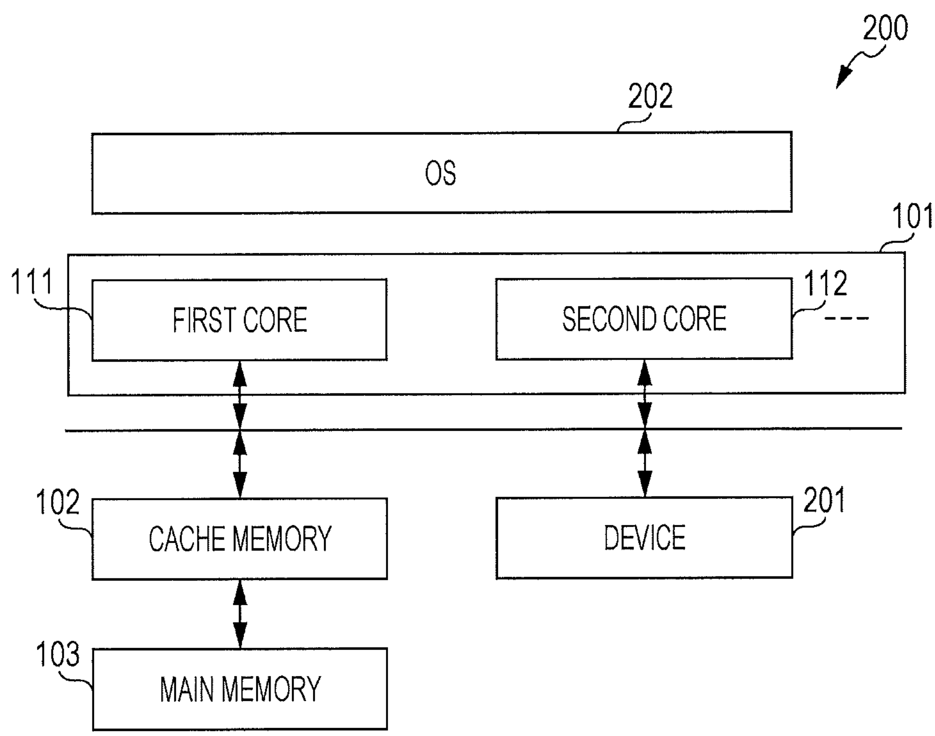
FIG. 2 is an explanatory diagram illustrating an example of a multicore processor system.

FIG. 2 is an explanatory diagram illustrating an example of a multicore processor system. An example of a multicore processor system 200 to be subjected to the calculation of performance values is described. The multicore processor system 200 includes the multicore processor 101, the cache memory 102, a device 201, and the main memory 103, for example. The multicore processor 101 is a target processor.

The multicore processor 101 controls the overall multicore processor system 200. The multicore processor 101 includes the first core 111 and the second core 112. The first core 111 and the second core 112 are processor cores. The cache memory 102 is a resource shared by the first core 111 and the second core 112. The cache memory 102 is a temporary storage device installed between the main memory 103 and the multicore processor 101. The main memory 103 is, for example, a random access memory (RAM).

The device 201 is a resource shared by the first core 111 and the second core 112. For example, the device 201 is an interface (I/F) connected through a communication line to a network NET such as a local area network (LAN), a wide area network (WAN), or the Internet. Alternatively, the device 201 is an input device such as a keyboard, a mouse, or a touch panel or is an output device such as a display or a printer, for example. Alternatively, the device 201 is a disk drive and a disk such as a magnetic disk or an optical disc, for example.

Example of Hardware Configuration of Calculating Device 100

Figure 3:
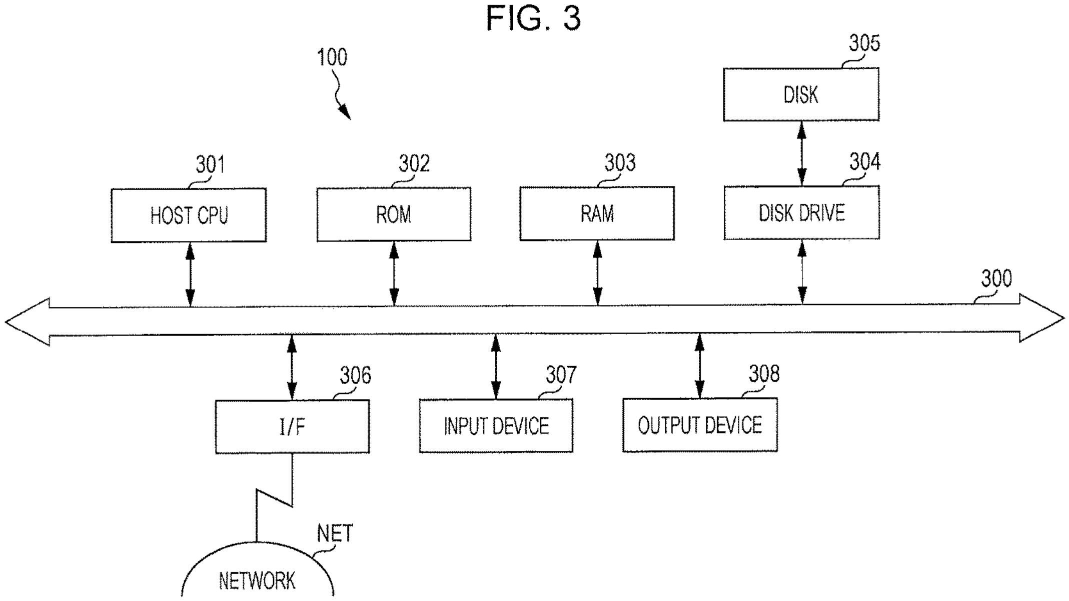
FIG. 3 is a block diagram illustrating an example of a hardware configuration of the calculating device.

FIG. 3 is a block diagram illustrating an example of a hardware configuration of the calculating device. The calculating device 100 includes a host CPU 301, a read only memory (ROM) 302, a RAM 303, a disk drive 304, and a disk 305. The calculating device 100 includes an interface (I/F) 306, an input device 307, and an output device 308. The parts 301 to 308 are connected to each other by a bus 300.

The host CPU 301 controls the overall calculating device 100. The ROM 302 stores programs including a boot program. The RAM 303 is a storage unit used as a work area of the host CPU 301. The disk drive 304 controls reading and writing of data from and in the disk 305 in accordance with control by the host CPU 301. The disk 305 stores data written under control by the disk drive 304. Examples of the disk 305 are a magnetic disk and an optical disc.

The I/F 306 is connected through a communication line to the network NET such as the LAN, the WAN, or the Internet and connected to another device through the network NET. The I/F 306 serves as an interface between the network NET and the internal parts of the calculating device 100 and controls input and output of data to and from an external device. A modem, a LAN adapter, or the like may be used as the I/F 306, for example.

The input device 307 is a keyboard, a mouse, a touch panel, or the like and is an interface configured to receive various types of data through a user operation. The input device 307 may acquire an image and a video image from a camera. In addition, the input device 307 may acquire a sound from a microphone. The output device 308 is an interface configured to output data in accordance with an instruction from the host CPU 301. Examples of the output device 308 are a display and a printer.

The first embodiment describes a first example and a second example. In the first example, when performance values of codes including instructions to access the main memory 103 are to be calculated by simulations of the execution of the codes by the cores, the performance values of the instructions are corrected based on the results of simulating the shared cache memory after the synchronization of the simulations of the cores. In the second example, when the cores access different physical address spaces, the performance values of the instructions are corrected based on the results of simulating the shared cache memory without the synchronization of the simulations of the cores.

First Example

In the first example, when the performance values of the codes are to be calculated by the simulations of the execution, by the cores, of the codes including the instructions to access the main memory 103, the performance values of the instructions are corrected based on the results of simulating the shared cache memory after the synchronization of the simulations of the cores. The accuracy of the calculation is improved by the correction.

Figure 4:
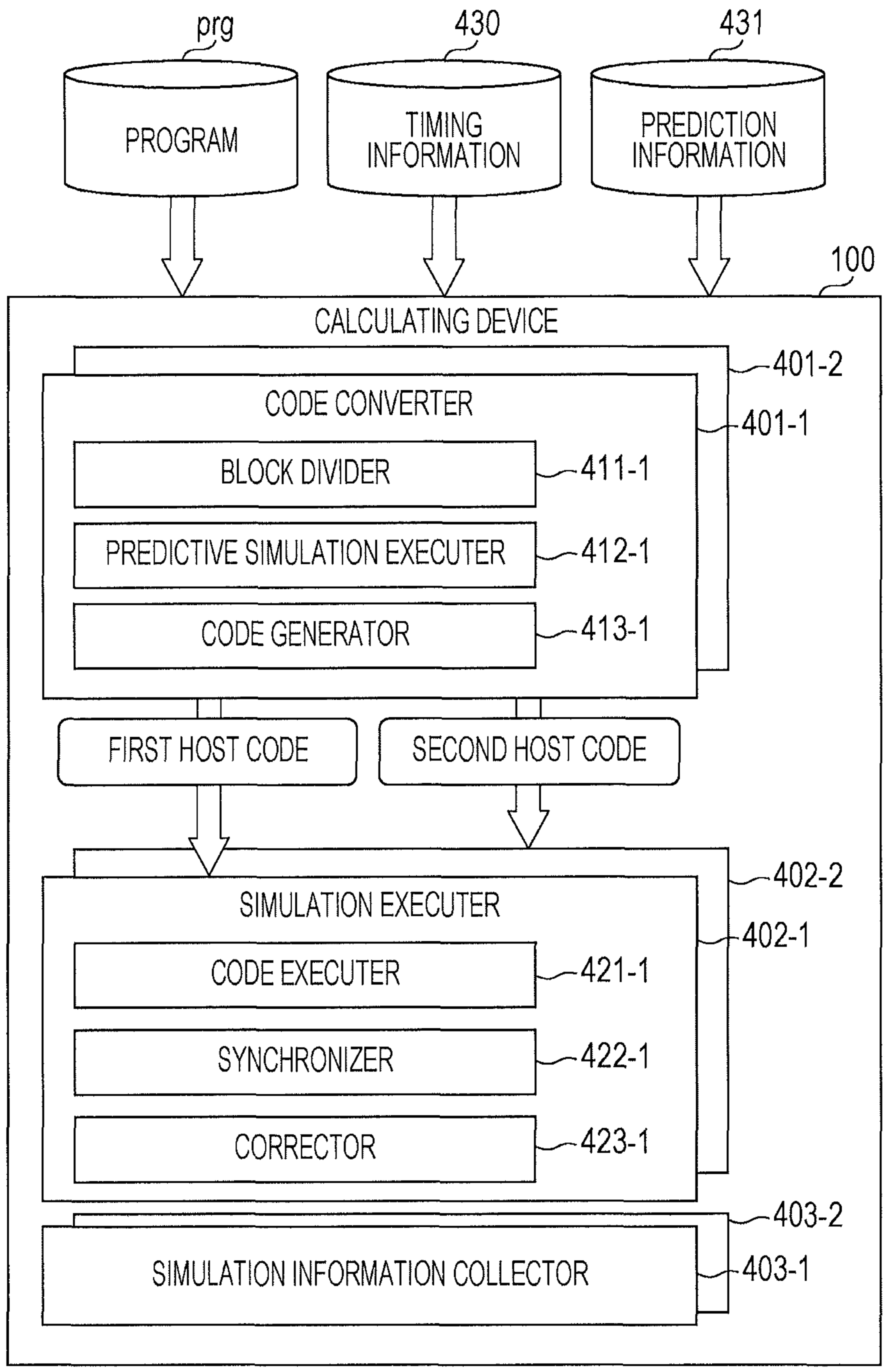
FIG. 4 is a block diagram illustrating an example of a functional configuration of the calculating device according to a first example.

Example of Functional Configuration of Calculating Device 100 According to First Example FIG. 4 is a block diagram illustrating an example of a functional configuration of the calculating device according to the first example. The calculating device 100 includes code converters 401, simulation executors 402, and simulation information collectors 403.

Processes of the code converters 401, the simulation executors 402, and the simulation information collectors 403 are coded in a calculation program stored in a storage device that is the disk 305 or the like and is accessible from the host CPU 301, for example. The host CPU 301 reads the calculation program stored in the storage device and executes the processes coded in the calculation program. Thus, the processes of the code converters 401, the simulation executors 402, and the simulation information collectors 403 are achieved. The results of the processes of the parts 401 to 403 are stored in storage devices such as the RAM 303 and the disk 305. Timing information 430, a target program prg, and prediction information 431 are acquired in advance and stored in the storage devices such as the RAM 303 and the disk 305.

The first embodiment describes the case where the target multicore processor 101 includes the two cores, as illustrated in FIG. 2. If the number of cores is larger than 2, the calculating device 100 includes the parts 401 to 403 for each of the cores. Hereinafter, "−1" represents processing parts for the first core 111, and "−2" represents processing parts for the second core 112. If processing parts have the same function, "−1" and "−2" are omitted in the following description.

Since examples of the timing information 430 and the prediction information 431 are the same as timing information and prediction information that are described in Japanese Laid-open Patent Publication No. 2013-84178, detailed examples of the information 430 and 431 are omitted.

Since the processes of the code converters 401 are the same as a code converter described in Japanese Laid-open Patent Publication No. 2013-84178, the code converters 401 are briefly described below. The code converters 401 each generate a calculation code that enables performance values of instructions of a target block to be calculated when the target block is executed by the multicore processor 101. Code executors 421 each execute a calculation code and thereby calculate performance values when the target block is executed by the multicore processor 101.

Specifically, the code converters 401 each includes a block divider 411, an predictive simulation executor 412, and a code generator 413.

The block divider 411 is configured to divide the target program prg input to the calculating device 100 into blocks in accordance with a predetermined standard. Regarding the timing of the division, when the target block is changed, a new target block may be divided. Alternatively, the target program prg may be divided into multiple blocks in advance. Units of the divided blocks may be basic block units or arbitrary predetermined code units. The basic block units are a instruction group from a branch instruction to a part immediately before the next branch instruction.

The predictive simulation executor 412 is configured to set, based on the prediction information 431, predicted cases for an external dependency instruction included in the target block. The predictive simulation executor 412 references the timing information 430 and simulates the progress of the execution of instructions included in the block while assuming the predicted cases. Thus, the predictive simulation executor 412 calculates performance values of the instructions included in the block while assuming the set predicted cases.

The code generator 413 is configured to generate a host code based on the results of simulating the predicted cases. The host code includes a function code for simulating an operation upon the execution of the target block by a core and a calculation code for calculating the performance values of the target block upon the execution of the target block by the core.

Figures 5, 6:
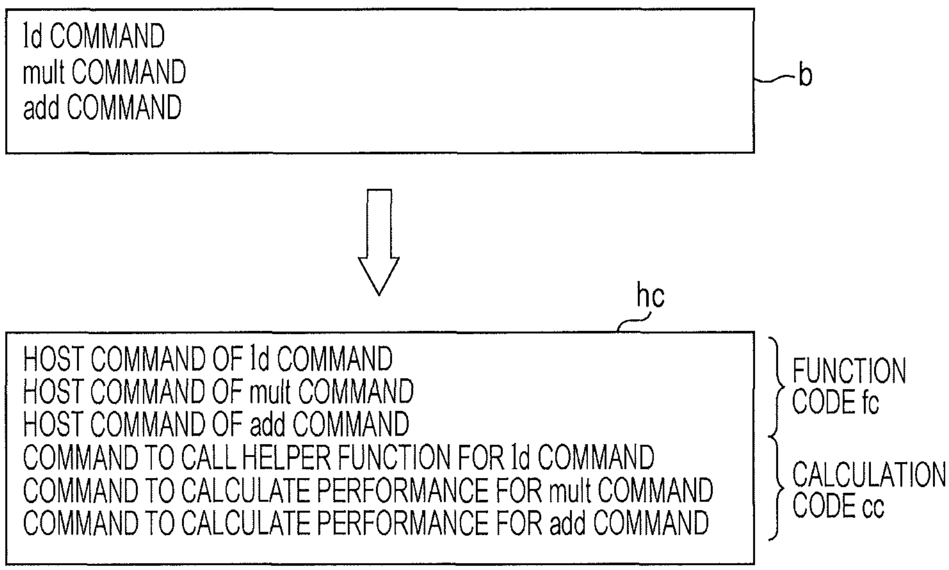
FIG. 5 is an explanatory diagram illustrating an example of a host code.
FIG. 6 is an explanatory diagram illustrating an example of recorded access times.

FIG. 5 is an explanatory diagram illustrating an example of the host code. For example, a host code hc includes a function code fc including a host instruction that is executable by the host CPU 301 and obtained by compiling instructions included in a target block b. In addition, the host code hc includes a calculation code cc including calculation instructions enabling performance values of the instructions included in the target block b to be calculated. For example, a performance value of an access instruction to access the main memory 103 is calculated by a instruction to call a helper function, while the access instruction is a ld instruction, a st instruction, or the like. In the first embodiment, the helper function serves as each of correctors 423. Calling and executing the helper function corresponds to correction executed by each of the correctors 423.

The simulation executors 402 are processing parts that each execute a host code hc generated by a code generator 413 and execute a function simulation and a performance simulation on the execution of instructions by a core that executes the program prg. The simulation executors 402 include code executors 421, synchronizers 422, and correctors 423.

The code executor 421-1 executes the first calculation process of calculating the first performance value of the first code c1 executed by the first core 111 by executing the first simulation sim1 to simulate the operation when the first core 111 executes the first code c1. The first code c1 includes the first access instruction to access the main memory 103. For example, the code executor 421-1 is a processing part that uses the first host code hc to execute a function simulation and a performance simulation when the multicore processor 101 executes the program prg. The code executor 421-1 executes the function simulation by executing the function code fc included in the host code hc. The code executor 421-1 executes the performance simulation by executing the calculation code cc included in the host code hc. As described in Japanese Laid-open Patent Publication No. 2013-84178, the next target block b may be identified by the function simulation.

The code executor 421-2 executes the second calculation process of calculating the second performance value of the second code c2 executed by the second core 112 by executing the second simulation sim2 to simulate the operation when the second core 112 executes the second code c2. The second code c2 includes the second access instruction to access the main memory 103. For example, the code executor 421-2 is a processing part that executes a function simulation and a performance simulation when the multicore processor 101 executes the program prg. The code executor 421-2 executes the function simulation by executing the function code fc. The code executor 421-2 executes the performance simulation by executing the calculation code cc.

The synchronizer 422-1 synchronizes the first simulation sim1 and the second simulation sim2 with each other when the first access instruction is executed in the first simulation sim1.

The corrector 423-1 executes a first correction process of correcting the first performance value calculated in the first calculation process after the synchronization executed by the synchronizer 422-1. The first correction process is to correct the first performance value by the third simulation sim3 of the operation of the cache memory 102 when the first core 111 accesses the main memory 103 through the cache memory 102 in accordance with the first access instruction. The third simulation sim3 is executed by providing an address to the modeled cache memory 102.

If time in the first simulation sim1 is after time in the second simulation sim2, the synchronizer 422-1 does not synchronize the second simulation sim2 with the first simulation sim1, and the corrector 423-1 corrects the first performance value calculated in the first calculation process by the third simulation sim3.

When the second access instruction is executed in the second simulation sim2, the synchronizer 422-2 synchronizes the first simulation sim1 and the second simulation sim2 with each other.

The corrector 423-2 executes a second correction process of correcting the second performance value calculated in the second calculation process after the synchronization executed by the synchronizer 422-2. The second correction process is to correct the second performance value by the third simulation sim3 of the operation of cache memory 102 when the second core 112 accesses the main memory 103 through the cache memory 102 in accordance with the second access instruction.

The simulation executor 402-2 causes the corrector 423-2 to execute the second correction process without causing the synchronizer 422-2 to execute the second synchronization process if time in the second simulation sim2 is after time in the first simulation sim1.

For example, when the first access instruction is executed in the first simulation sim1, the corrector 423-1 records a simulation time when access is executed in the first simulation sim1. For example, when the second access instruction is executed in the second simulation sim2, the corrector 423-2 records a simulation time when access is executed in the second simulation sim2.

FIG. 6 is an explanatory diagram illustrating an example of the recorded access times. In an access time table 600, access times that are simulation times when access instructions occur in the simulations, and addresses to be accessed in accordance with the access instructions, may be set.

The access time table 600 includes a first core time field, a first core address field, a second core time field, and a second core address field. In the first core time field, simulation times when access instructions are executed in the first simulation sim1 are set. In the first core address field, destinations to be accessed in accordance with the access instructions in the first simulation sim1 are set. In the second core time field, simulation times when access instructions are executed in the second simulation sim2 are set. In the second core address field, destinations to be accessed in accordance with the access instructions in the second simulation sim2 are set.

Figure 7A:
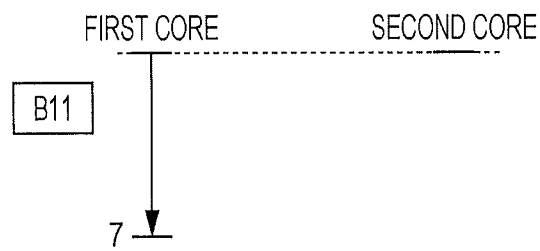
FIGS. 7A to 7C are explanatory diagrams illustrating an example of operations according to the first example.

FIGS. 7A to 7C and 8A and 8B are explanatory diagrams illustrating examples of operations according to the first example. In FIGS. 7A to 8B, the address fields of the access time table 600 are omitted. As illustrated in FIG. 7A, the target block b is a block B11 in the first simulation sim1, and a simulation time when a simulation of the target block b is terminated in the first simulation sim1 is represented by 7. The simulation time is represented by the number of cycles, for example.

Figure 7B:
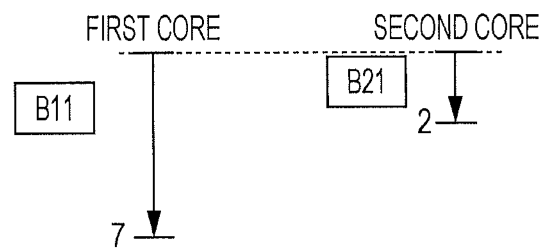

As illustrated in FIG. 7B, the target block b is a block B21 in the second simulation sim2, and a simulation time when a simulation of the target block b is terminated in the second simulation sim2 is represented by 2.

Figure 7C:
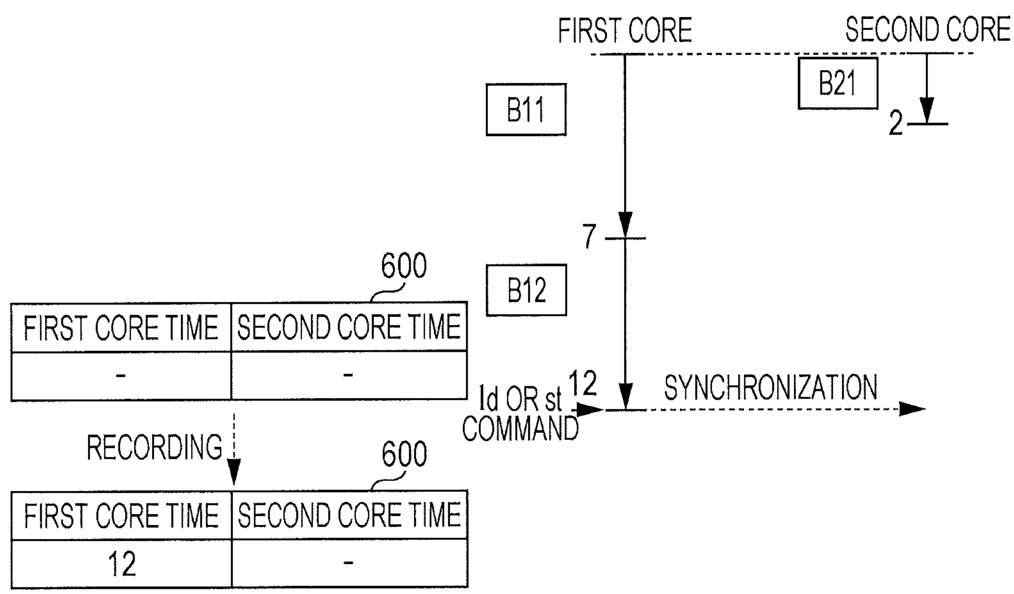

As illustrated in FIG. 7C, the target block b is a block B12 in the first simulation sim1, and an access instruction is executed at a time represented by 12 in the first simulation sim1. As illustrated in FIG. 7C, the corrector 423-1 records, in the access time table 600, a simulation time when the access is executed in the first simulation sim1. As illustrated in FIG. 7C, the synchronizer 422-1 determines whether or not time in the first simulation sim1 is after time in the second simulation sim2. As illustrated in FIG. 7C, since time in the first simulation sim1 is not after time in the second simulation sim2, the synchronizer 422-1 synchronizes the first simulation sim1 and the second simulation sim2 with each other. Thus, the synchronizer 422-1 causes the first simulation sim1 to wait to be executed.

Figure 8A:
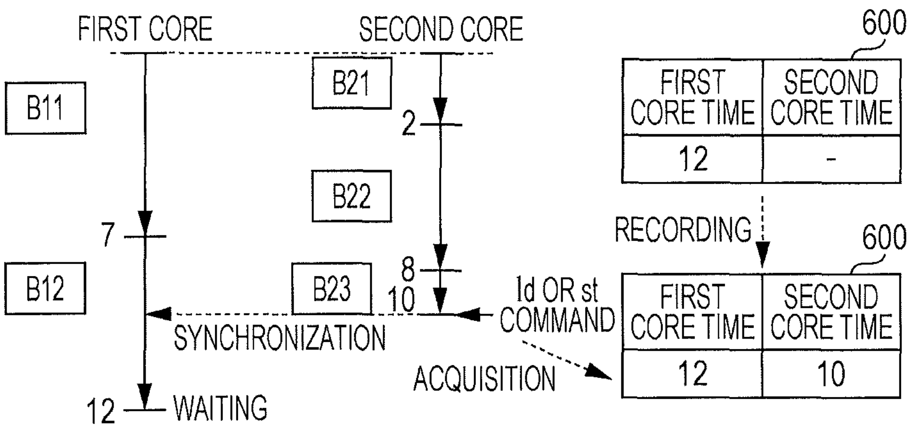
FIGS. 8A and 8B are explanatory diagrams illustrating another example of operations according to the first example.

As illustrated in FIG. 8A, the target block b is a block B23 in the second simulation sim2, and an access instruction is executed at a time represented by 10 in the second simulation sim2. As illustrated in FIG. 8A, the corrector 423-2 records, in the access time table 600, a simulation time when the access instruction is executed in the second simulation sim2, for example. As illustrated in FIG. 8A, the synchronizer 422-2 determines whether or not time in the second simulation sim2 is after time in the first simulation sim1. As illustrated in FIG. 8A, since time in the second simulation sim2 is after time in the first simulation sim1, the synchronizer 422-2 does not synchronize the first simulation sim1 with the second simulation sim2.

Thus, the corrector 423-2 acquires, from the access time table 600, a simulation time that is closest among simulation times earlier than time in the second simulation sim2. In this example, since a time that is earlier than time in the simulation sim2 is not recorded, the corrector 423-2 acquires 0. Then, the corrector 423-2 executes a process of correcting a performance value of the access instruction in the second simulation sim2 based on time in the second simulation sim2 and the acquired time, for example. Specifically, for example, the corrector 423-2 corrects the performance value of the access instruction based on an address to be accessed in accordance with the access instruction in the second simulation sim2, time in the second simulation sim2, the acquired time, and functions used for the correction process. A specific example of the correction process is illustrated in FIG. 9.

Figure 8B:
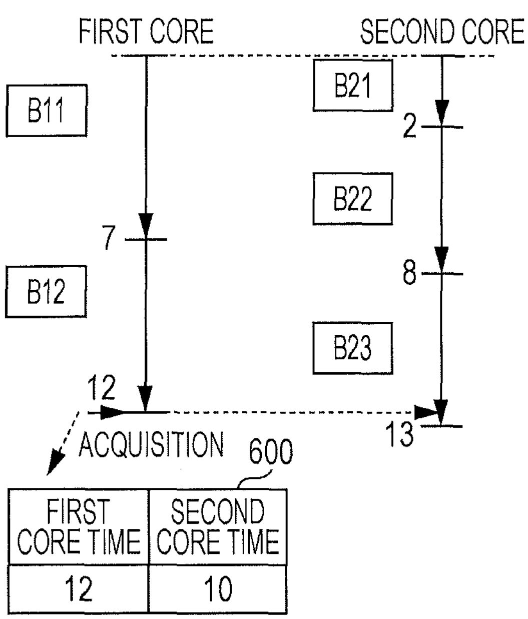

Next, as illustrated in FIG. 8B, the corrector 423-1 acquires the closest simulation time from the access time table 600 after the first simulation sim1 and the second simulation sim2 are synchronized with each other. The closest simulation time is the closest simulation time among the simulation times earlier than time in the second simulation sim2. Then, the corrector 423-1 executes the process of correcting the performance value of the access instruction in the first simulation sim1 based on time in the first simulation sim1 and the acquired time, for example. Specifically, for example, the corrector 423-1 corrects the performance value of the access instruction based on an address to be accessed in accordance with the access instruction in the first simulation sim1, time in the first simulation sim1, the acquired time, and the functions used for the correction process.

FIG. 9 is an explanatory diagram illustrating an example of the functions used for the correction process and included in a helper function for a ld instruction. In this example, "rep_delay" of the helper function represents a time (extension time) that is among penalty times and is not processed as a delay time before the execution of the next instruction that uses a return value of the ld instruction. In the example illustrated in FIG. 9, "pre_delay" represents a delay time received from the previous instruction; "−1" represents that there is no delay in the previous instruction; and "rep_delay" and "pre_delay" are time information obtained from the results of a process of statically analyzing the timing information 430 and performance simulation results obtained by the predictive simulation executor 412.

In the example illustrated in FIG. 9, if the difference between the current timing current_time and an execution time preld_time of the previous ld instruction exceeds the delay time pre_delay of the previous ld instruction, the corrector 423 adjusts the delay time pre_delay so as to cause the delay time pre_delay to be equal to or smaller than the difference between the execution time preld_time of the previous ld instruction and the current timing current_time and calculates an available delay time avail_delay.

Next, if the result of the operation of the cache memory 102 is a "cache miss", a predicted case is an error and the corrector 423 adds a penalty time cache_miss_latency at the time of the cache miss to the available delay time avail_delay and corrects a performance value of the ld instruction based on the extension time rep_delay. A specific process of the correction is the same as Japanese Laid-open Patent Publication No. 2013-84178, and a detailed description thereof is omitted.

The simulation information collectors 403 are processing parts that are each configured to collect simulation information including execution times of instructions as the results of the execution of the performance simulation.

Figure 10:
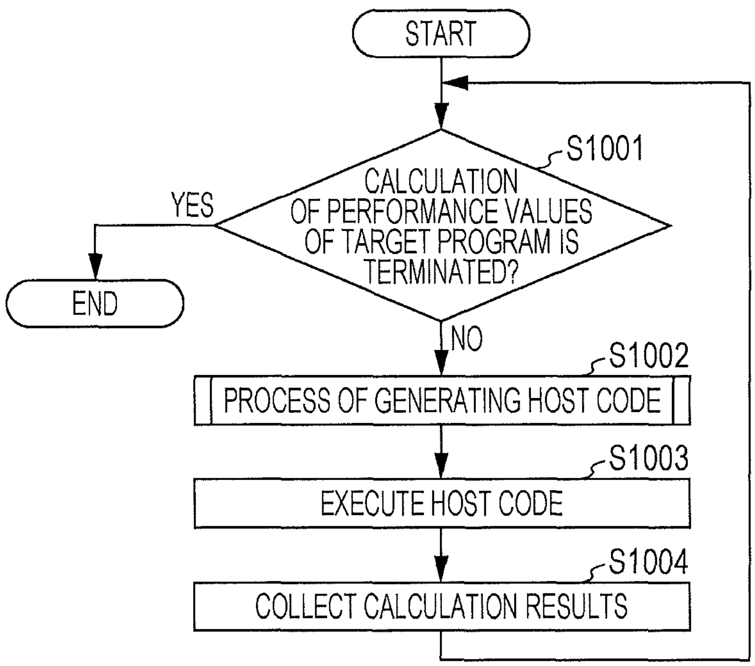
FIG. 10 is a flowchart of an example of a procedure for a calculation process to be executed by the calculating device according to the first example.

Example of Procedure for Calculation Process by Calculating Device 100 according to First Example FIG. 10 is a flowchart of an example of a procedure for a calculation process to be executed by the calculating device according to the first example. The calculating device 100 executes the procedure for the calculation process on each of the cores included in the multicore processor 101. For example, the calculating device 100 determines whether or not the calculation of performance values of the target program prg is terminated (in step S1001). For example, if the calculating device 100 determines that the calculation is not terminated (No in step S1001), the calculating device 100 executes a process of generating a host code hc (in step S1002).

For example, the calculating device 100 executes the host code hc (in step S1003). Then, for example, the calculating device 100 collects the results of the calculation (in step 1004) and causes the process to return to step S1001. If the calculating device 100 determines that the calculation is terminated (Yes in step S1001), the calculating device 100 terminates the process.

Figure 11:
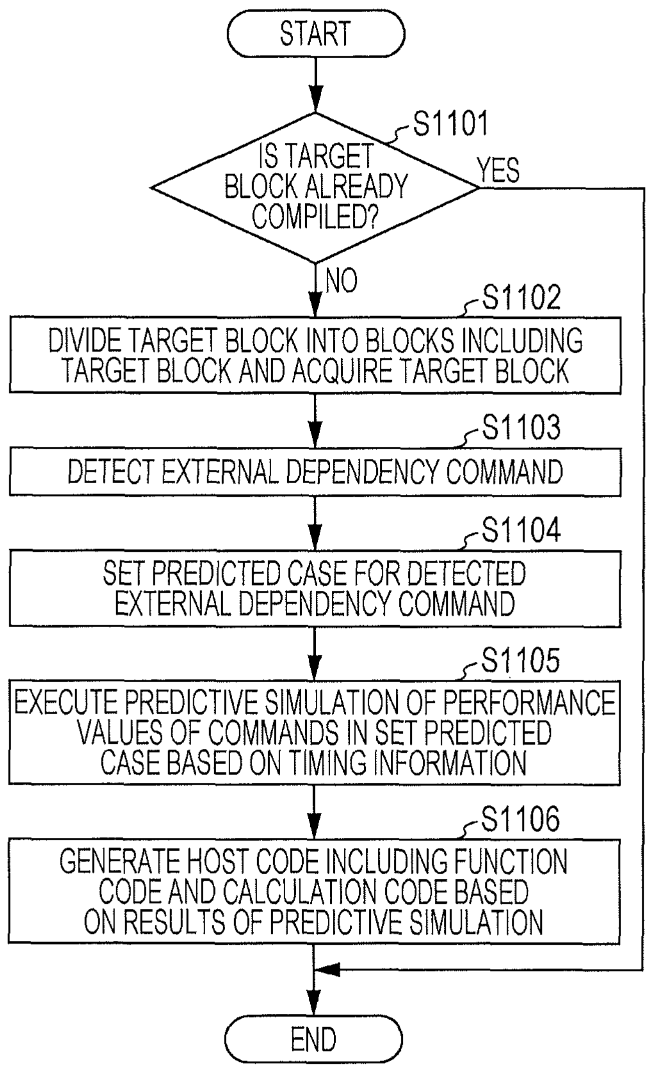
FIG. 11 is a flowchart of an example of a procedure for a generation process illustrated in FIG. 10.

FIG. 11 is a flowchart of an example of a procedure for the generation process illustrated in FIG. 10. For example, the calculating device 100 determines whether or not the target block b is already compiled (in step S1101). If the calculating device 100 determines that the target block b is not compiled (No in step S1101), the calculating device 100 divides the target program prg into blocks including the target block b and acquires the target block b (in step S1102). The calculating device 100 detects an external dependency instruction (in step S1103).

Next, the calculating device 100 sets a predicted case for the detected external dependency instruction (in step S1104). Then, the calculating device 100 executes, based on the timing information 430, predictive simulation of performance values of instructions for the set predicted case (in step S1105). Next, the calculating device 100 generates the host code hc including a function code fc and a calculation code cc based on the results of the predictive simulation (in step S1106) and terminates the generation process. If the calculating device 100 determines that the target block b is already compiled (Yes in step S1101), the calculating device 100 terminates the generation process.

Figure 12:
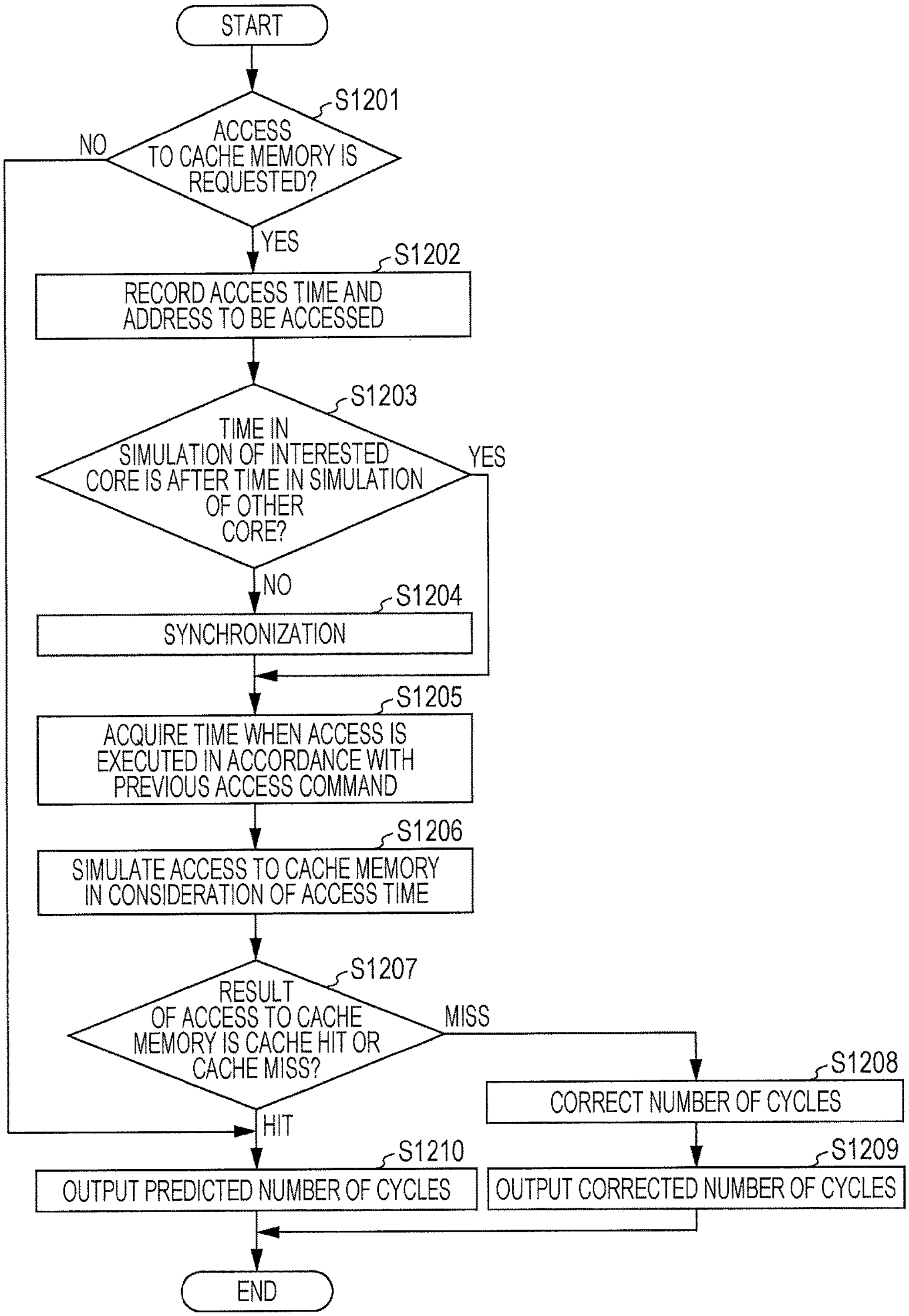
FIG. 12 is a flowchart of an example of a procedure for a calculation process to be executed by the calculating device according to the first example in accordance with a helper function for a cache memory.

FIG. 12 is a flowchart of an example of a procedure for a calculation process to be executed by the calculating device according to the first example in accordance with a helper function for the cache memory. First, the calculating device 100 determines whether or not access to the cache memory is requested (in step S1201). If the calculating device 100 determines that the access to the cache memory is not requested (No in step S1201), the calculating device 100 causes the calculation process to proceed to step S1210.

If the calculating device 100 determines that the access to the cache memory is requested (Yes in step S1201), the calculating device 100 records an access time and an address to be accessed (in step S1202). The calculating device 100 determines whether or not time in a simulation of an interested core is after time in a simulation of the other core (in step S1203). If the calculating device 100 determines whether time in the simulation of the interested core is after time in the simulation of the other core (Yes in step S1203), the calculating device 100 causes the process to proceed to step S1205. If the calculating device 100 determines whether time in the simulation of the interested core is not after time in the simulation of the other core (No in step S1203), the calculating device 100 synchronizes the simulations with each other (in step S1204). The calculating device 100 acquires a simulation time when access is executed in accordance with the previous access instruction (in step S1205).

Then, the calculating device 100 simulates the access to the cache memory in consideration of the access time (in step S1206). Next, the calculating device 100 determines whether the result of the access to the cache memory is a cache hit or a cache miss (in step S1207).

If the calculating device 100 determines that the result of the access to the cache memory is the cache miss (Miss in step S1207), the calculating device 100 corrects the number of cycles (in step S1208). Then, the calculating device 100 outputs the corrected number of cycles (in step S1209) and terminates the process.

If the calculating device 100 determines that the result of the access to the cache memory is the cache hit (Hit in step S1207), the calculating device 100 outputs a predicted number of cycles (in step S1210) and terminates the process.

Second Example

For example, if different cores access different physical address regions, performance values do not depend on which core first access a physical address region. For example, a case where the different cores access the different physical address regions is when the first core 111 and the second core 112 execute different application programs or the like. In the second example, when the first core 111 and the second core 112 access different physical address spaces, the two simulations are not synchronized. Thus, while the accuracy of the calculation of performance values is maintained, the speed of the calculation is improved. In the second example, configurations that are the same as the first example are represented by the same reference numerals and symbols as the first example, and a detailed description thereof is omitted.

Figure 13:
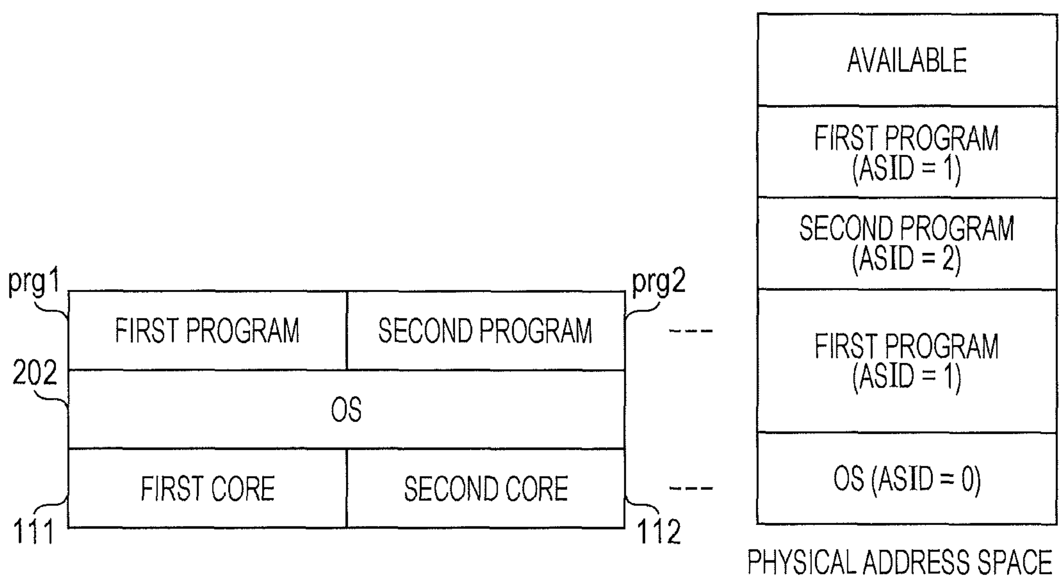
FIG. 13 is an explanatory diagram illustrating an example of preconditions according to a second example.

FIG. 13 is an explanatory diagram illustrating an example of preconditions according to the second example. In the second example, the first core 111 and the second core 112 execute a single OS 202. For example, it is assumed that the first core 111 and the second core 112 execute different programs on the OS 202, respectively. For example, if physical addresses to be accessed are different for the programs, address space identifiers are assigned to the programs, respectively. For example, the address space identifiers are abbreviated to ASIDs. In the example illustrated in FIG. 13, the ASID of a first program prg1 is 1, the ASID of a second program prg2 is 2, and the ASID of the OS 202 is 0.

Figure 14:
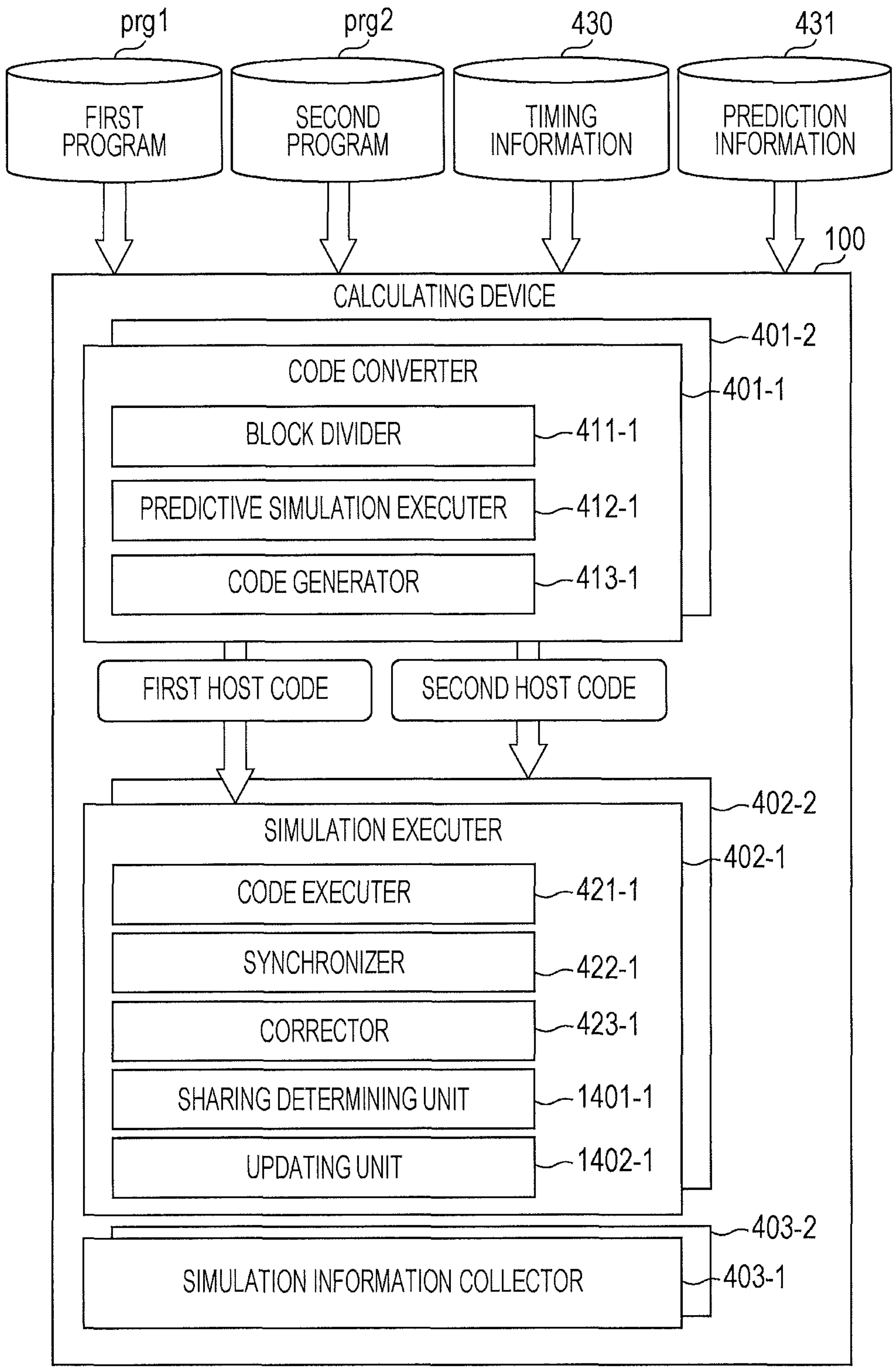
FIG. 14 is a block diagram illustrating an example of a functional configuration of the calculating device according to the second example.

Example of Functional Configuration of Calculating Device 100 According to Second Example FIG. 14 is a block diagram illustrating an example of a functional configuration of the calculating device according to the second example. The calculating device 100 includes code converters 401, simulation executors 402, and simulation information collectors 403.

The code converters 401 each include a block divider 411, a predictive simulation executor 412, and a code generator 413. The block dividers 411, the predictive simulation executors 412, and the simulation information collectors 403 are the same as the first example, and a detailed description thereof is omitted. Processes of the code converters 401, the predictive simulation executors 402, and the simulation information collectors 403 are coded in the calculation program stored in a storage device that is the disk 305 or the like and is accessible from the host CPU 301, for example. The host CPU 301 reads the calculation program stored in the storage device and executes the processes coded in the calculation program. Thus, the processes of the code converters 401, the predictive simulation executors 402, and the simulation information collectors 403 are achieved. The results of the processes of the parts 401 to 403 are, for example, stored in storage devices such as the RAM 303 and the disk 305. The timing information 430, the target program prg, and the predicted information 431 are acquired in advance and stored in the storage devices such as the RAM 303 and the disk 305.

For example, if the target multicore processor system 200 includes an ARM processor, a instruction to change a system control register occurs upon a context switch executed by a scheduler in the kernel of the OS 202. The instruction to change the system control register is, for example, a instruction to change a set value of the system control register and is able to change a physical address space. If the target multicore processor system 200 includes the ARM processor, the instruction to change the system control register is an mcr instruction. Examples of the mcr instruction are described as follows.

mcr p15, 0, r0, c13, c0, 1

The aforementioned mcr instruction is a instruction to read a value of r0 in a c13 register. In the system control register of the ARM processor, the c13 register is a register for storing the ASIDs of the programs.

Figures 15, 16:
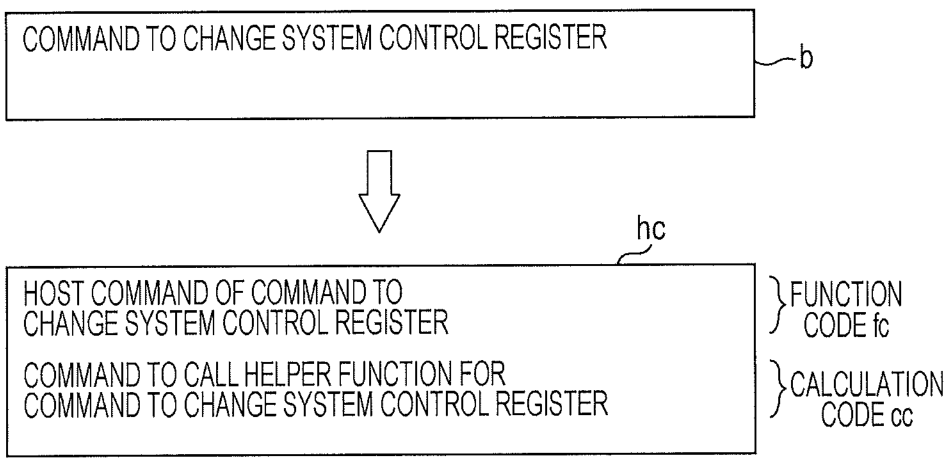
FIG. 15 is an explanatory diagram illustrating an example of the generation of a host code of an instruction to change a system control register.
FIG. 16 is an explanatory diagram illustrating an example of a sharing status table.

FIG. 15 is an explanatory diagram illustrating an example of the generation of a host code of the instruction to change the system control register. For example, a target block b illustrated in FIG. 15 includes the instruction to change the system control register. If the target block b includes the instruction to change the system control register, the code generator 413 generates a host code hc including a host instruction of the instruction to change the system control register and a instruction to call a helper function for the instruction to change the system control register. The host instruction of the instruction to change the system control register is a function code fc. The instruction to call the helper function for the instruction to change the system control register is a calculation code cc. A process by the helper function for the instruction to change the system control register is achieved by the updating unit 1402.

The simulation executors 402 are processing parts that each execute a host code hc generated by a code generator 413 and execute a function simulation and a performance simulation on the execution of a instruction by a core that executes a program. The simulation executors 402 include code executors 421, synchronizers 422, correctors 423, sharing determining units 1401, and updating units 1402.

When the instruction to change the system control register is executed in the first simulation sim1, the updating unit 1402-1 changes a value of the system control register in the first simulation sim1. It is assumed that a model of the system control register is shared and used in the first simulation sim1 and the second simulation sim2. The updating unit 1402-1 determines whether or not a register to be changed in accordance with the instruction to change the system control register has an ASID stored therein.

If the register to be changed has the ASID stored therein, the updating unit 1402-1 compares the ASID for the interested core with an ASID for the other core. The updating unit 1402-1 registers information in a sharing status table based on the result of the comparison.

FIG. 16 is an explanatory diagram illustrating an example of the sharing status table. For example, a sharing status table 1600 represents whether or not an address space is shared in a simulation for each core. The sharing status table 1600 includes a core field and a sharing field. In the core field, identifiers that identify cores are set. In the sharing status table 1600, the number of the cores is four as an example. In each row of the sharing field, the identifier of a core sharing an address space with an interested core or "none" is set. "None" represents that a core that shares a physical address space with an interested core does not exist.

For example, if a core that matches an ASID for an interested core does not exist, the updating unit 1402-1 registers "none" in a record for the interested core in the sharing status table 1600. For example, if the core that matches the ASID for the interested core exists, the updating unit 1402 registers the identifier of the matching core in the record for the interested core in the sharing status table 1600.

If the first access instruction is executed in the first simulation sim1, the sharing determining unit 1401-1 determines whether or not memory regions that are included in the main memory 103 and used between the cores in the simulations match each other. For example, the sharing determining unit 1401-1 determines whether or not a memory region that is included in the main memory 103 and used by the first core 111 in the first simulation sim1 matches a memory region that is included in the main memory 103 and used by the second core 112 in the second simulation sim2. For example, the sharing determining unit 1401 makes the determination based on set details of the modeled system control register in the simulations. Specifically, for example, the sharing determining unit 1401 references a record for the interested core in the sharing status table 1600, thereby determines whether or not a core sharing a physical address space with the interested core exists, and determines whether or not the memory regions match each other.

If the sharing determining unit 1401-1 determines that the memory regions do not match each other, the simulation executor 402-1 does not cause the synchronizer 422-1 to execute the first synchronization process and causes the corrector 423-1 to execute the first correction process. If the sharing determining unit 1401-1 determines that the memory regions match each other, the simulation executor 402-1 causes the synchronizer 422-1 to execute the first synchronization process and causes the corrector 423-1 to execute the first correction process after the first synchronization process.

In addition, processes of the parts of the simulation executor 402-2 are the same as the processes of the parts of the simulation executor 402-1, and a detailed description thereof is omitted.

Procedure for Calculation Process by Calculating Device 100 according to Second Example A procedure for a calculation process by the calculating device according to the second example is the same as the procedure, illustrated in FIGS. 10 and 11, for the calculation process by the calculating device according to the first example. Thus, an example of a process procedure to be executed by the helper function for the cache memory 102 according to the second example and an example of a process procedure to be executed by the helper function for the instruction to change the system control register according to the second example are described below.

Figure 17:
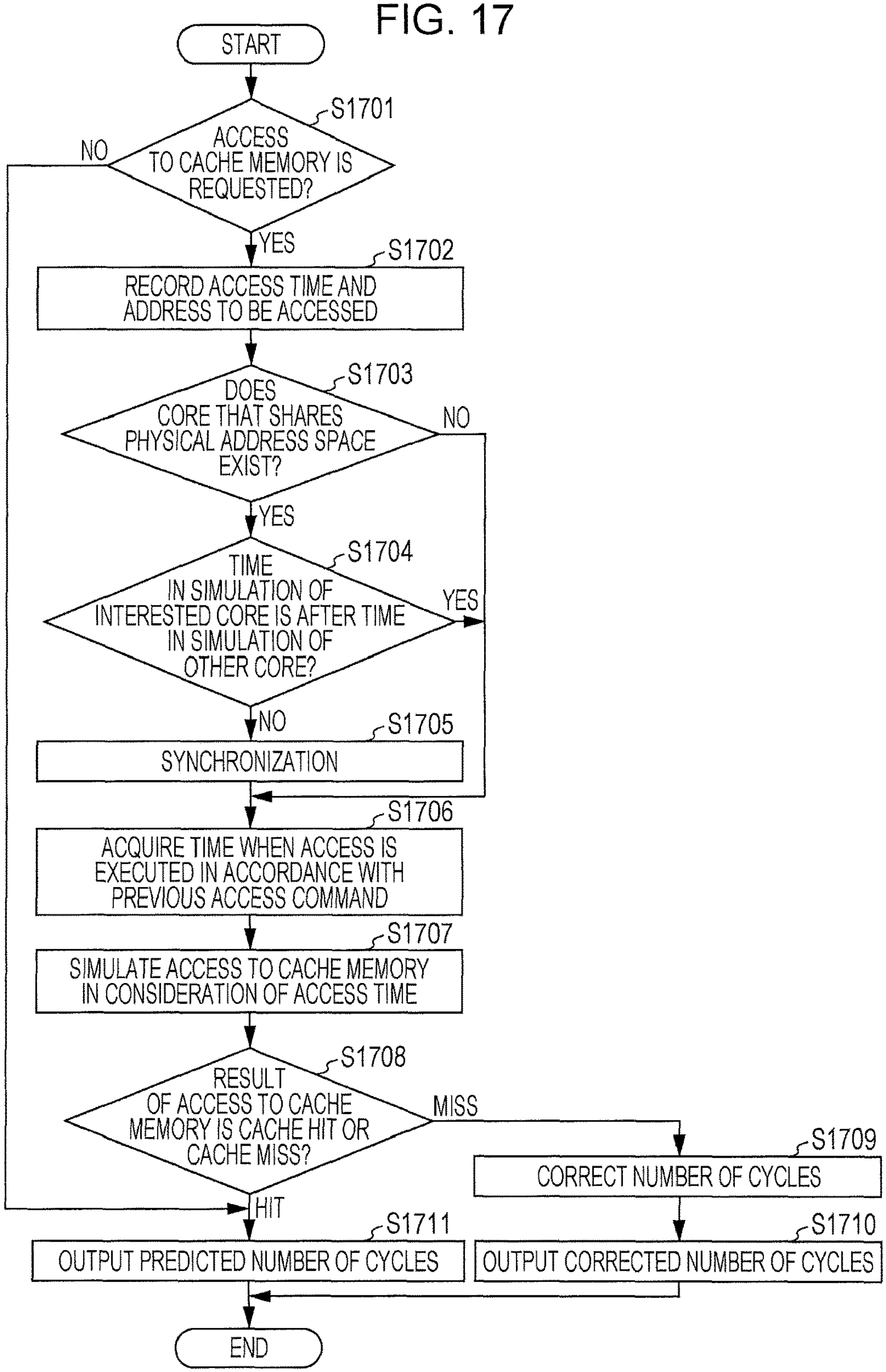
FIG. 17 is a flowchart of an example of a procedure for a calculation process to be executed by the calculating device according to the second example in accordance with the helper function for the cache memory.

FIG. 17 is a flowchart of an example of a procedure for a calculation process to be executed by the calculating device according to the second example in accordance with the helper function for the cache memory. First, the calculating device 100 determines whether or not access to the cache memory is requested (in step S1701). If the calculating device 100 determines that the access to the cache memory is not requested (No in step S1701), the calculating device 100 causes the process to proceed to step S1711.

If the calculating device 100 determines that the access to the cache memory is requested (Yes in step S1701), the calculating device 100 records an access time and an address to be accessed (in step S1702). The calculating device 100 determines, based on the sharing status table 1600, whether or not a core that shares a physical address space exists (in step S1703). If the calculating device 100 determines that the core that shares the physical address space does not exist (No in step S1703), the calculating device 100 causes the process to proceed to step S1706. If the calculating device 100 determines that the core that shares the physical address space exists (Yes in step S1703), the calculating device 100 determines whether or not time in a simulation of an interested core is after time in a simulation of the other core (in step S1704). If the calculating device 100 determines that time in the simulation of the interested core is after time in the simulation of the other core (Yes in step S1704), the calculating device 100 causes the process to proceed to step S1706. On the other hand, if the calculating device 100 determines that time in the simulation of the interested core is not after time in the simulation of the other core (No in step S1704), the calculating device 100 synchronizes the simulations with each other (in step S1705). The calculating device 100 acquires a simulation time when access is executed in accordance with the previous access instruction (in step S1706).

Then, the calculating device 100 simulates the access to the cache memory in consideration of the access time (in step S1707). Next, the calculating device 100 determines whether the result of the access to the cache memory is a cache hit or a cache miss (in step S1708).

If the calculating device 100 determines that the access to the cache memory is the cache miss (Miss in step S1708), the calculating device 100 corrects the number of cycles (in step S1709). Then, the calculating device 100 outputs the corrected number of cycles (in step S1710) and terminates the process. If the calculating device 100 determines that the access to the cache memory is the cache hit (Hit in step S1708), the calculating device 100 outputs a predicted number of cycles (in step S1711) and terminates the process.

Figure 18:
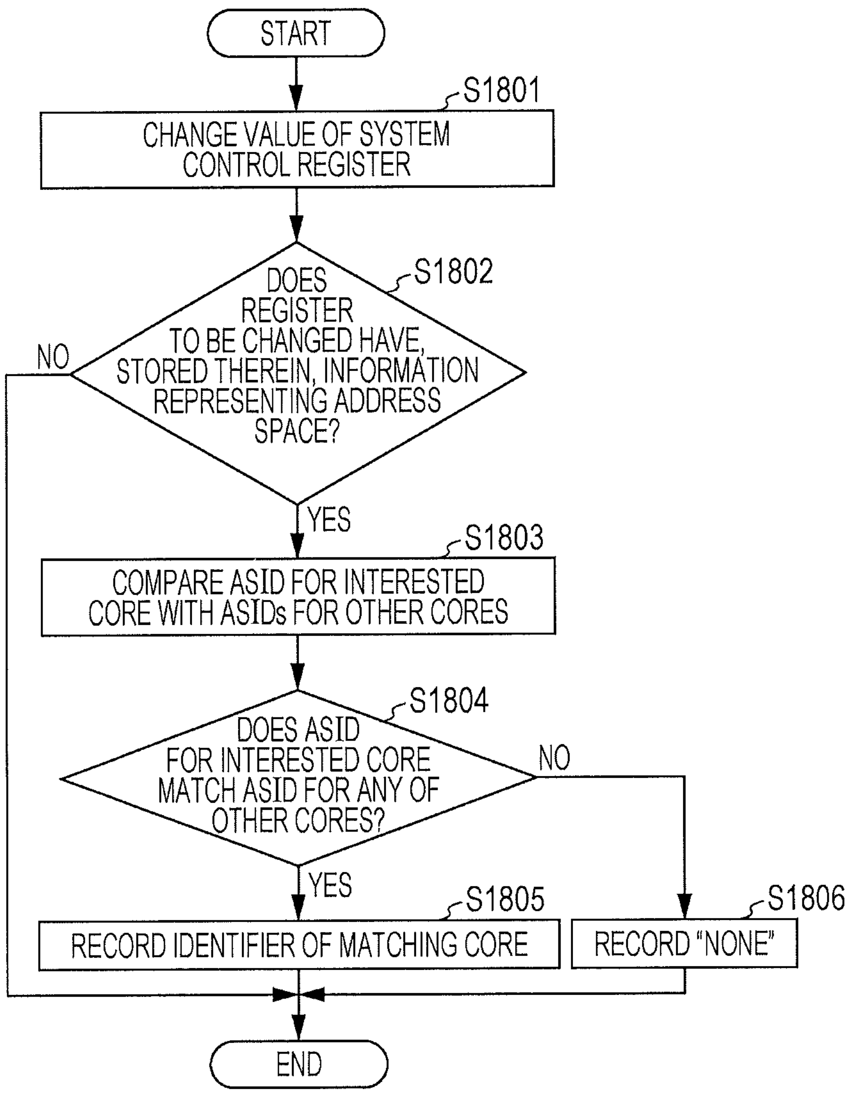
FIG. 18 is a flowchart of an example of a procedure for a calculation process to be executed by the calculating device in accordance with a helper function for the instruction to change the system control register.

FIG. 18 is a flowchart of an example of a procedure for a calculation process to be executed by the calculating device 100 in accordance with the helper function for the instruction to change the system control register. The calculating device 100 changes a value of the modeled system control register (in step S1801). The calculating device 100 determines whether or not a register to be changed has, stored therein, information representing an address space (in step S1802).

If the calculating device 100 determines that the register to be changed does not have the information representing the address space (No in step S1802), the calculating device 100 terminates the process. If the calculating device 100 determines that the register to be changed has, stored therein, the information representing the address space (Yes in step S1802), the calculating device 100 compares the ASID for the interested core with ASIDs for other cores (in step S1803). The calculating device 100 determines whether or not the ASID for the interested core matches an ASID for any of the other cores (in step S1804).

If the calculating device 100 determines that the ASID for the interested core matches an ASID for any of the other cores (Yes in step S1804), the calculating device 100 records the identifier of the matching core (in step S1805) and terminates the process. If the calculating device 100 determines that the ASID for the interested core does not match the ASIDs for the other cores (No in step S1804), the calculating device 100 records "none" (in step S1806) and terminates the process.

As described above, the calculating device 100 simulates the shared cache memory when performance values of codes are calculated by the simulations of the execution, by the cores, of the codes including instructions to access the main memory after the synchronization of the simulations of the cores. The calculating device 100 corrects the performance values of the instructions based on the results of the simulations of the shared cache memory. In this manner, by synchronizing the first simulation sim1 with the second simulation sim2, the accuracy of the simulations for the order of the execution of the access instructions of the cores is improved. Thus, since the accuracy of the simulations for cache hits and cache misses that occur in the cache memory 102 in response to the access instructions is improved, the accuracy of the calculation may be improved.

In addition, if time in the first simulation is after time in the second simulation, the calculating device 100 does not synchronize the first simulation with the second simulation and corrects the performance values of the access instructions based on the results of simulating the shared cache memory. If time in the first simulation sim1 is after time in the second simulation sim2, an access instruction that occurs in the second simulation sim2 before an access instruction in the first simulation sim1 is already executed. Thus, since it may be determined that the order in which the access instructions are executed by the cores is maintained, a time used for the simulations may be reduced by avoiding the execution of the synchronization process.

In addition, if the cores access different physical address spaces, the calculating device 100 does not execute the process of synchronizing the simulations of the cores and corrects performance values of access instructions based on the results of simulating the shared cache memory. If physical address spaces to be accessed by the cores are different, it is determined that destinations to be accessed do not overlap, and thus the time used for the simulations may be reduced by avoiding the execution of the synchronization process.

Second Embodiment

The calculating device according to a second embodiment and a calculation method according to the second embodiment are described below. The calculating device according to the second embodiment and the calculation method according to the second embodiment are provided to calculate performance values in a heterogeneous processor system. In the heterogeneous processor system, a CPU and an accelerator share the same address space and the same data.

The accelerator is a device configured to substitute a CPU process and improve the efficiency of the process. Examples of the accelerator are a graphics processing unit (GPU), a digital signal processor (DSP), and a field-programmable gate array (FPGA).

The following describes a case where the GPU is used as the accelerator. The accelerator, however, is not limited to the GPU.

Figure 19:
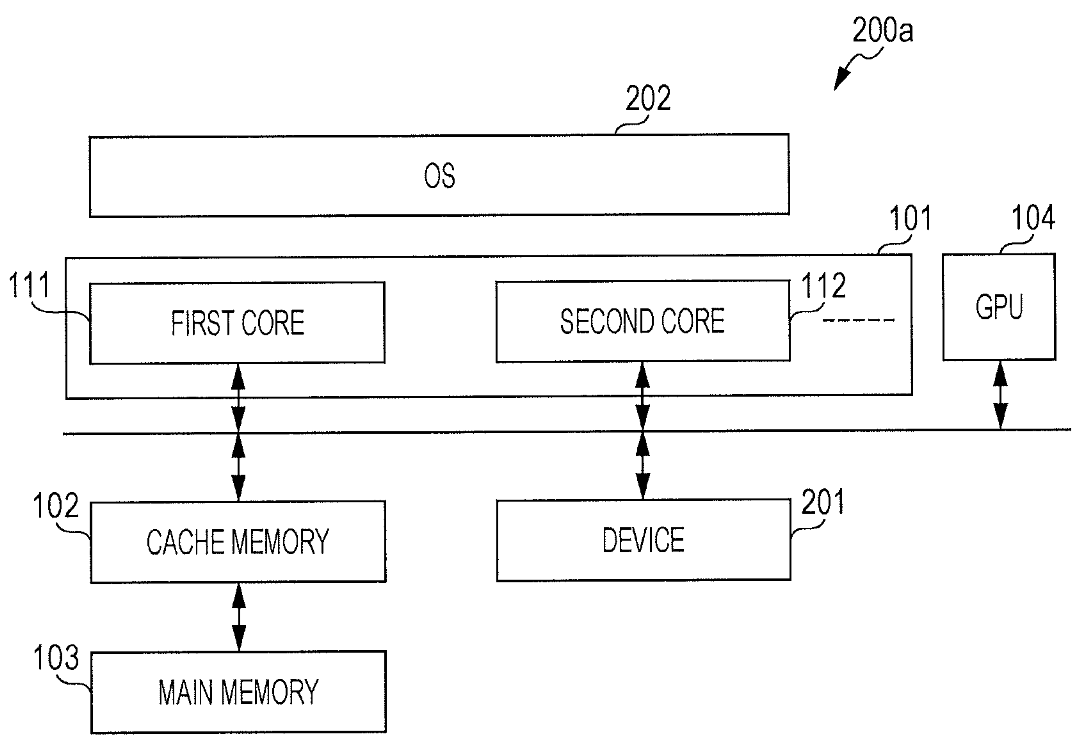
FIG. 19 is an explanatory diagram illustrating an example of a heterogeneous processor system.

FIG. 19 is an explanatory diagram illustrating an example of the heterogeneous processor system. Elements that are the same as the multicore processor system illustrated in FIG. 2 are represented by the same reference numerals as FIG. 2, and a description thereof is omitted.

A heterogeneous processor system 200*a* includes a GPU 104. In the example illustrated in FIG. 19, the GPU 104 shares the cache memory 102 and the main memory 103 with the multicore processor 101. The following assumes that the multicore processor 101 is the CPU.

The calculation method according to the second embodiment may be achieved by the calculating device 100 having the hardware configuration illustrated in FIG. 3.

The calculation method according to the second embodiment is described with a third example and a fourth example.

Third Example

Figure 20:
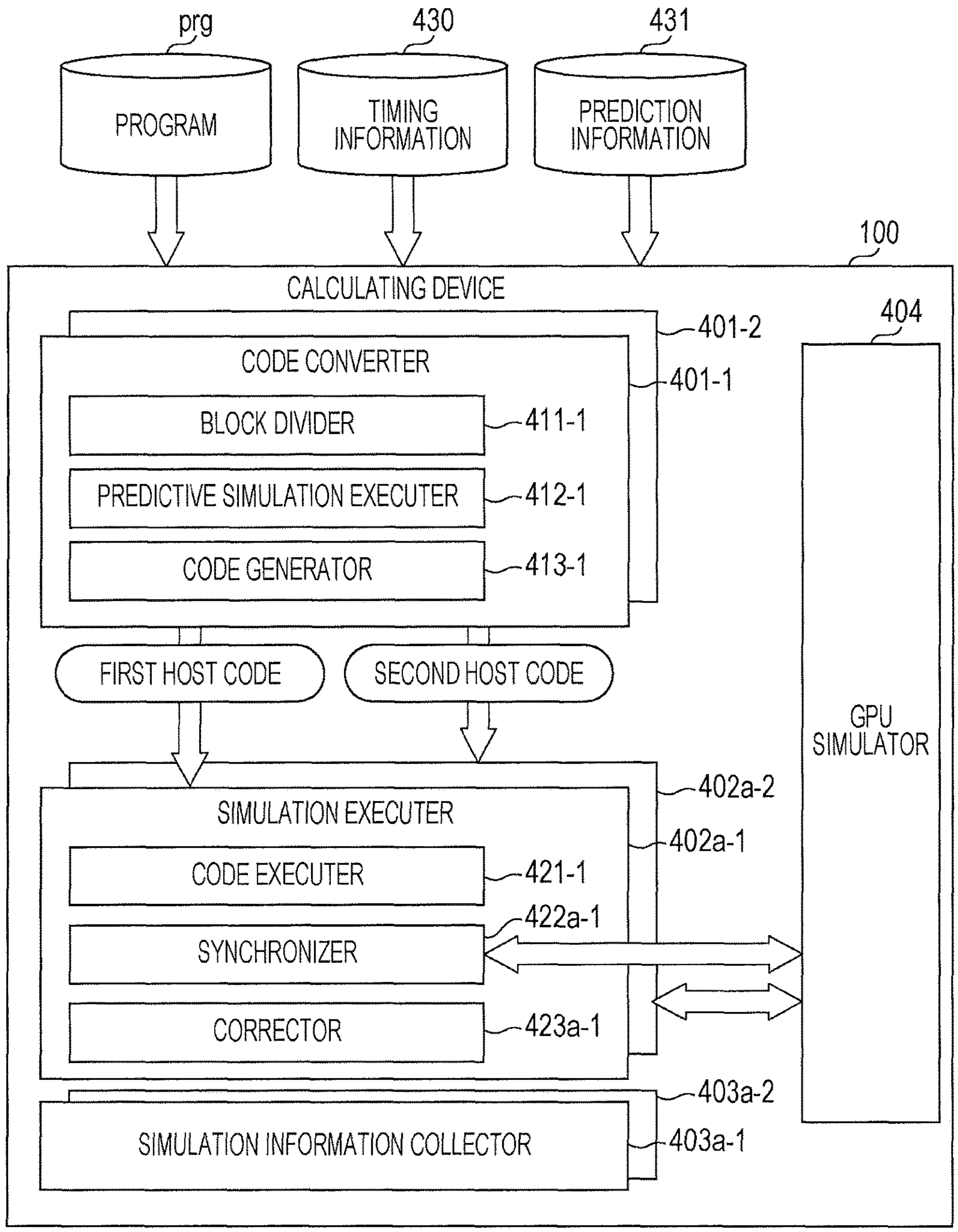
FIG. 20 is a block diagram illustrating an example of a functional configuration of the calculating device according to a third example.

Example of Functional Configuration of Calculating Device 100 According to Third Example FIG. 20 is a block diagram illustrating an example of a functional configuration of the calculating device according to the third example. Elements that are illustrated in FIG. 20 and are the same as the first example illustrated in FIG. 4 are represented by the same reference numerals and symbols as the first example illustrated in FIG. 4, and a description thereof is omitted.

The calculating device 100 includes a GPU simulator 404. The GPU simulator 404 simulates the GPU 104 included in the heterogeneous processor system 200*a* that is illustrated in FIG. 19 and of which performance values are to be calculated.

The GPU simulator 404 has a function of recording the time when the GPU 104 accesses the main memory 103. The GPU simulator 404 also has a function of temporarily stopping and restarting an operation of the GPU 104. In addition, the GPU simulator 404 has a function of executing synchronization with simulator executors 402*a*-1 and 402*a*-2 that are configured to execute the simulations of the CPU.

The process of the GPU simulator 404 is coded in the calculation program stored in the storage device that is the disk 305 or the like and is accessible from the host CPU 301. The host CPU 301 reads the calculation program stored in the storage device and executes the process coded in the calculation program. Thus, the process of the GPU simulator 404 is achieved. In addition, the results of the process of the GPU simulator 404 are stored in the storage devices such as the RAM 303 and the disk 305, for example.

The simulation executors 402*a*-1 and 402*a*-2 have functions that are the same as or similar to the simulation executors 402-1 and 402-2 illustrated in FIG. 4. The simulation executors 402*a*-1 and 402*a*-2, however, have a function of executing synchronization with the GPU simulator 404.

For example, a synchronizer 422*a*-1 of the simulation executor 402*a*-1 executes the process of synchronizing the aforementioned first simulation sim1 with the aforementioned second simulation sim2 and executes a process of synchronizing the first simulation sim1 with a GPU simulation.

The synchronizer 422*a*-1 acquires, from the GPU simulator 404, the time when the GPU 104 accesses the main memory 103. Thus, the process of synchronizing the first simulation sim1 with the GPU simulation may be executed in a manner that is the same as or similar to the process of synchronizing the first simulation sim1 with the second simulation sim2.

For example, if the time when a instruction to access a certain address of the main memory 103 occurs in the first simulation sim1 is earlier than the time when a instruction to access the certain address occurs in the GPU simulation, the synchronizer 422*a*-1 causes the first simulation sim1 to wait to be executed. If the time when the instruction to access the certain address of the main memory 103 occurs in the first simulation sim1 is after the time when the instruction to access the certain address occurs in the GPU simulation, the synchronizer 422*a*-1 causes the GPU simulation to wait to be executed.

In addition, the corrector 423*a*-1 executes a correction process based on the process of synchronizing the first simulation sim1 with the GPU simulation in a manner that is the same as or similar to the correction process based on the process of synchronizing the first simulation sim1 with the second simulation sim2.

The same applies to a process of synchronizing the second simulation sim2 with the GPU simulation and a correction process to be executed based on the process of synchronizing the second simulation sim2 with the GPU simulation.

In addition, simulation information collectors 403*a*-1 and 403*a*-2 collect the results of executing a performance simulation based on the process of synchronizing the first simulation sim1 with the GPU simulation, the process of synchronizing the second simulation sim2 with the GPU simulation, and the correction processes.

Example of Procedure for Calculation Process by Calculating Device 100 according to Third Example The flow of an overall calculation process and the flow of a process of generating a host code are the same as or similar to the flowcharts illustrated in FIGS. 10 and 11, and a description thereof is omitted.

Figure 21:
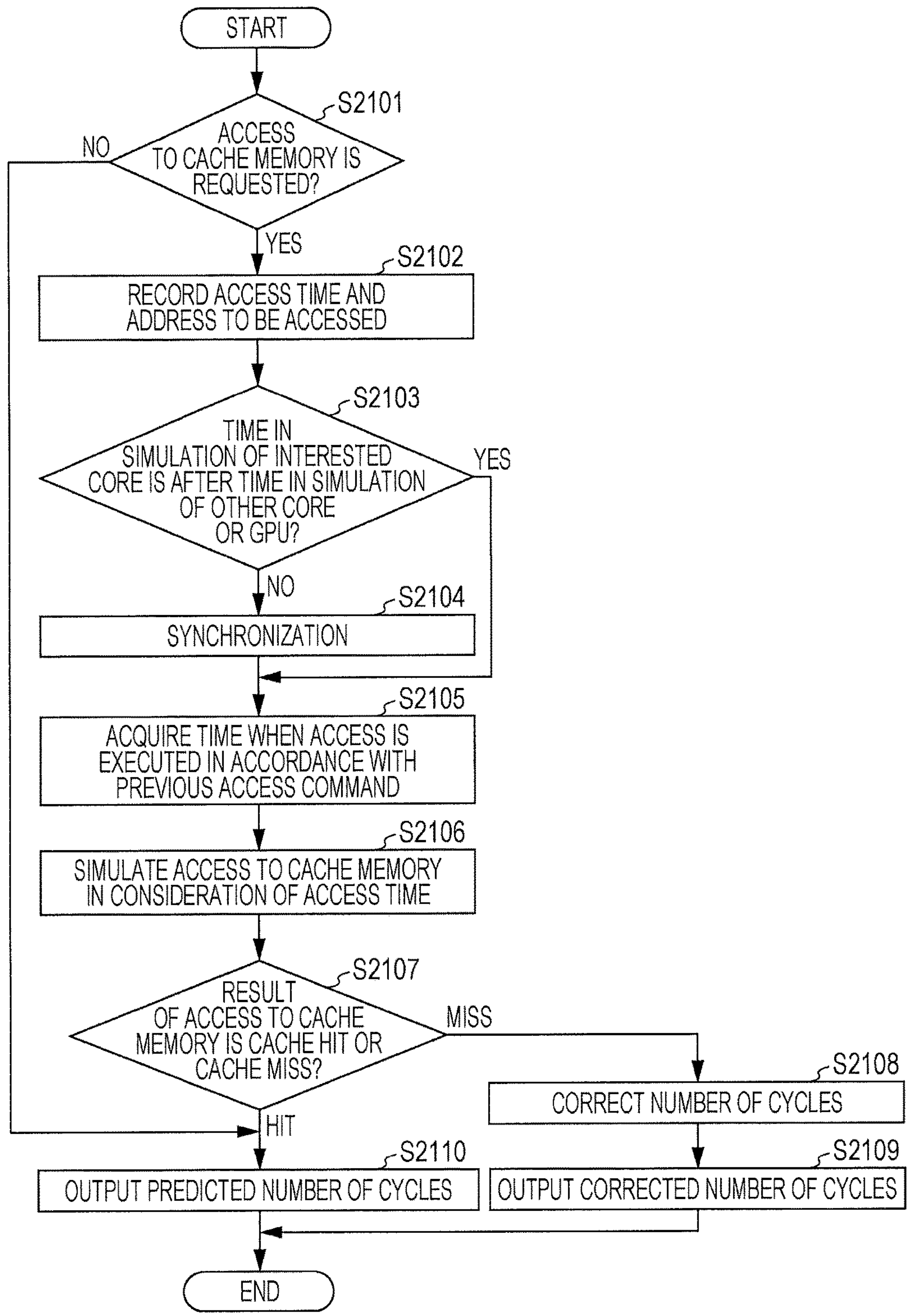
FIG. 21 is a flowchart of an example of a procedure for a calculation process to be executed by the calculating device according to the third example in accordance with the helper function for the cache memory.

FIG. 21 is a flowchart of an example of a procedure for a calculation process to be executed by the calculating device according to the third example in accordance with the helper function for the cache memory.

A process of step S2101 is the same as the process of step S1201 illustrated in FIG. 12, and a description thereof is omitted. In a process of step S2102, the calculating device 100 records not only access times and addresses to be accessed in the simulations sim1 and sim2 but also an access time and an address to be accessed in the GPU simulation.

In a process of step S2103, the calculating device 100 determines whether or not time in the simulation of the interested core is after time in the simulation of the other core or time in the GPU simulation. If the calculating device 100 determines that time in the simulation of the interested core is after time in the simulation of the other core or time in the GPU simulation (Yes in step S2103), the calculating device 100 causes the process to proceed to step S2105. Specifically, the calculating device 100 does not cause the interested core to wait to be executed and omits the synchronization process.

If the calculating device 100 determines that time in the simulation of the interested core is not after time in the simulation of the other core or time in the GPU simulation (No in step S2103), the calculating device 100 synchronize the simulations with each other (in step S2104). For example, if a simulation time when an access instruction is executed by the interested core in the simulation is earlier than a simulation time when an access instruction is executed by the GPU 104 in the GPU simulation, the calculating device 100 causes the simulation of the interested core to wait to be executed and synchronizes the simulation of the interested core with the GPU simulation.

Processes of steps S2105 to S2110 are the same as the processes of steps S1205 to S1210 illustrated in FIG. 12, and a description thereof is omitted.

Fourth Example

Figure 22:
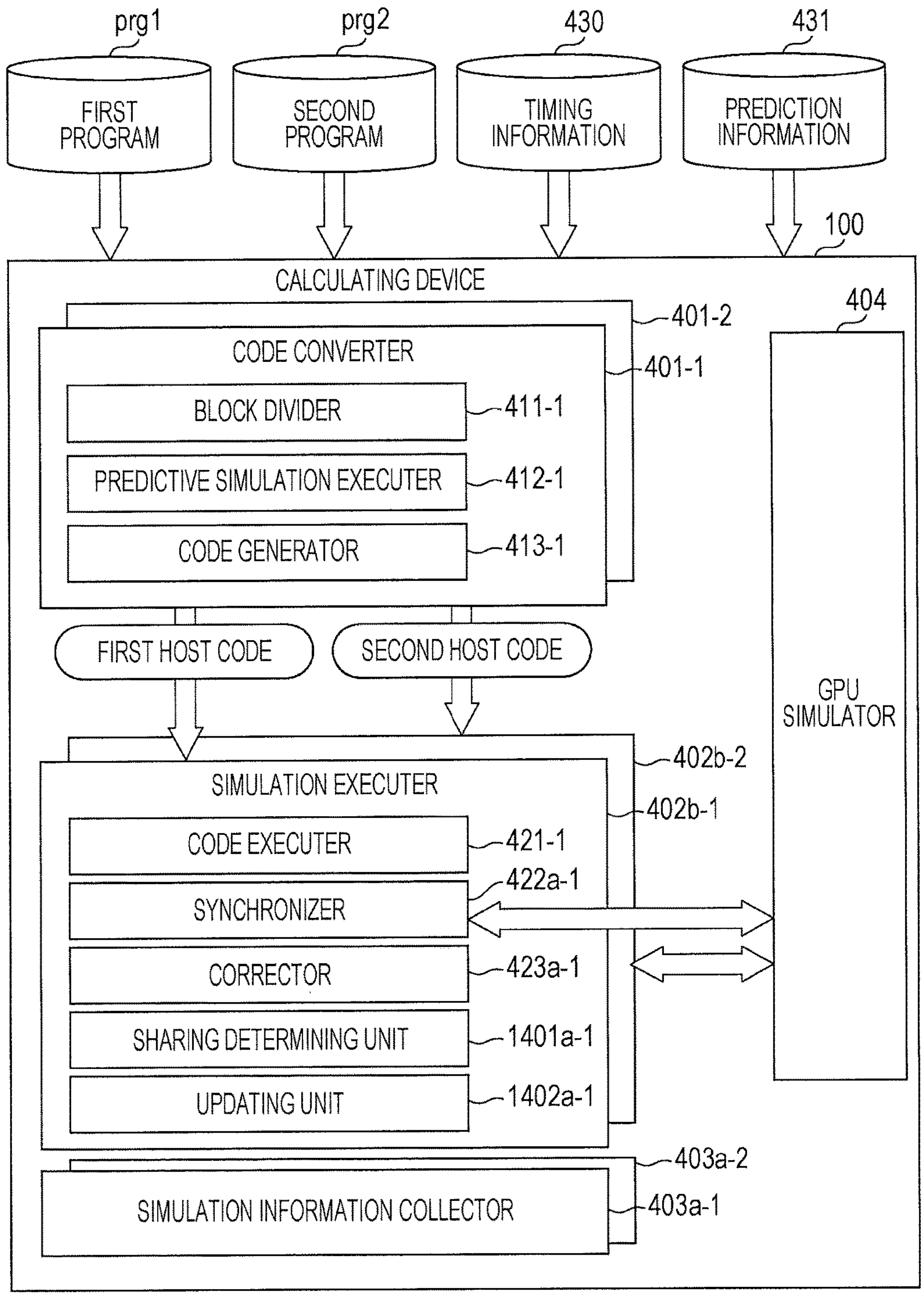
FIG. 22 is a block diagram illustrating an example of a functional configuration of the calculating device according to a fourth example.

Example of Functional Configuration of Calculating Device 100 according to Fourth Example FIG. 22 is a block diagram illustrating an example of a functional configuration of the calculating device according to the fourth example. Elements that are illustrated in FIG. 22 and are the same as FIGS. 14 and 20 are represented by the same reference numerals and symbols as FIGS. 14 and 20, and a description thereof is omitted.

In the calculating device 100, a simulation executor 402*b*-1 that is different from the simulation executor 402*a*-1 illustrated in FIG. 20 further includes a sharing determining unit 1401*a*-1 and an updating unit 1402*a*-1. Although not illustrated, a simulation executor 402*b*-2 includes the same units as the simulation executor 402*b*-1.

The updating unit 1402*a*-1 has functions that are the same as or similar to the updating unit 1402-1 illustrated in FIG. 14. If the ASID for the interested core matches an ASID for the GPU 104, the updating unit 1402*a*-1 sets an identifier identifying the GPU 104 in the sharing status table 1600 illustrated in FIG. 16.

The sharing determining unit 1401*a*-1 has functions that are the same as or similar to the sharing determining unit 1401-1 illustrated in FIG. 14. The sharing determining unit 1401*a*-1, however, determines whether or not the interested core shares a physical address space with the other core. In addition, the sharing determining unit 1401*a*-1 determines whether or not the interested core shares a physical address space with the GPU 104. Specifically, the sharing determining unit 1401*a*-1 determines whether or not a memory region that is included in the main memory 103 and used by the interested core in the first simulation matches a memory region that is included in the main memory 103 and used by the GPU 104 in the GPU simulation. If the memory region that is included in the main memory 103 and used by the interested core in the first simulation does not match the memory region that is included in the main memory 103 and used by the GPU 104 in the GPU simulation, the interested core may not be synchronized with the GPU 104.

For example, the sharing determining unit 1401*a*-1 references a record for the interested core in the aforementioned sharing status table 1600 and determines whether or not the other core or the GPU shares a physical address space with the interested core.

Example of Procedure for Calculation Process by Calculating Device 100 according to Fourth Example The flow of an overall calculation process and the flow of a process of generating a host code are the same as the flowcharts illustrated in FIGS. 10 and 11, and a description thereof is omitted.

Figure 23:
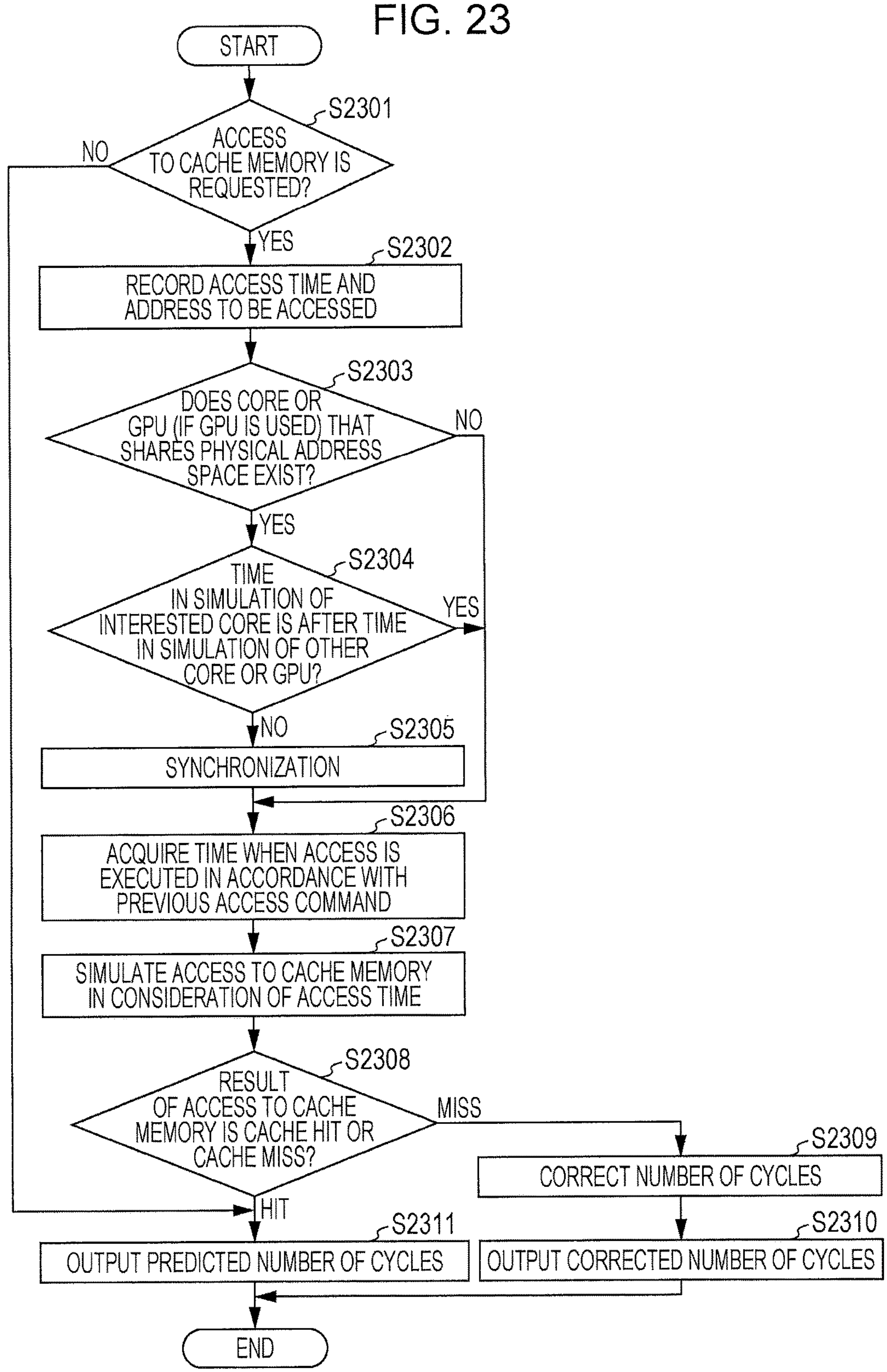
FIG. 23 is a flowchart of an example of a procedure for a calculation process to be executed by the calculating device according to the fourth example in accordance with the helper function for the cache memory.

FIG. 23 is a flowchart of an example of a procedure for a calculation process to be executed by the calculating device according to the fourth example in accordance with the helper function for the cache memory.

A process of step S2301 is the same as the process of step S1201 illustrated in FIG. 12, and a description thereof is omitted. In a process of step S2302, the calculating device 100 records not only access times and addresses to be accessed in the simulations sim1 and sim2 but also an access time and an address to be accessed in the GPU simulation.

In a process of step S2103, the calculating device 100 determines, based on the aforementioned sharing status table 1600, whether or not a core that shares a physical address space exists or where or not a core that shares a physical address space with the GPU exists if the GPU is used. If the calculating device 100 determines that the core that shares the physical address space exists or if the GPU is used and the calculating device 100 determines that the core that shares the physical address space with the GPU exists (Yes in step S2303), a process of step S2304 is executed. If the calculating device 100 determines that the core that shares the physical address space does not exist and the GPU is not used or if the GPU is used and the calculating device 100 determines that the core that shares the physical address space with the GPU does not exist (No in step S2303), a process of step S2306 is executed.

For example, if the GPU 104 independently operates to execute a drawing process or the like, and the core that shares the physical address space with the GPU 104 does not exist, the calculation process transitions from the process of step S2303 to the process of step S2306.

Processes of steps S2304 and S2305 are the same as the processes of steps S2103 and S2104 illustrated in FIG. 21, processes of steps S2306 to S2311 are the same as the processes of steps S1205 to S1210 illustrated in FIG. 12, and a description thereof is omitted.

Effects that are the same as or similar to the calculating device according to the first embodiment and the calculation method according to the first embodiment are obtained by the calculating device according to the aforementioned second embodiment and the calculation method according to the second embodiment. In addition, by synchronizing the simulations executed by the CPU (multicore processor) with the GPU simulation, the accuracy of simulating the order of the execution of instructions to access the main memory from the CPU and the GPU is improved. Thus, since performance values may be calculated in consideration of access to the main memory from the GPU, the accuracy of calculating the performance values is improved.

If the time when a instruction to access the main memory is executed in the first simulation is after the time when a instruction to access the main memory is executed in the GPU simulation, a time used for the simulations may be reduced by avoiding the execution of the synchronization process.

If a memory region (physical address space) that is included in the main memory and shared by the CPU and the GPU does not exist, or if the GPU is not used, a time used for the simulations may be reduced by avoiding the execution of the synchronization process.

The calculation methods described in the first and second embodiment may be achieved by causing a computer such as a personal computer or a workstation to execute the prepared calculation program. The calculation program is stored in a computer-readable storage medium such as a magnetic disk, an optical disc, or a universal serial bus (USB) flash memory. The calculation program is read by the computer from the storage medium and executed by the computer. The calculation program may be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A device for determining performance of a multicore processor having first and second cores able to access a same main memory through a same cache memory, the device comprising:

a memory, and a processor coupled to the memory and configured to execute a process of obtaining a first performance value of a first code executed by the first core and including a first access instruction to access the main memory, by executing a first simulation in a model of the multicore processor, including the cache memory, to simulate a first operation when the first core executes the first code, obtaining, after the obtaining of the first performance value, a second performance value of a second code executed by the second core and including a second access instruction to access the main memory, by executing a second simulation in the model of the multicore processor, including the cache memory, to simulate a second operation when the second core executes the second code, synchronizing the first simulation with the second simulation when the first access instruction is executed in the first simulation, correcting, by executing a third simulation to simulate a third operation of the cache memory when the first core accesses the main memory through the cache memory in accordance with the first access instruction, the first performance value calculated after synchronization by the synchronizing, and determining, when the first access instruction is executed in the first simulation, whether a first memory region that is included in the main memory and used by the first core in the first simulation matches a second memory region that is included in the main memory and used by the second core in the second simulation, and when the first and second memory regions do not match, the synchronizing is not performed.

2. The device according to claim 1, the process further comprising: synchronizing, when the first access instruction is executed in the first simulation, the first simulation with an accelerator simulation executed to simulate a fourth operation of an accelerator able to access the main memory and then performing the correcting.

3. The device according to claim 2, wherein when a first time of the first simulation is after a second time of the accelerator simulation, the synchronizing of the first and accelerator simulations is not performed.

4. The device according to claim 2, wherein if the first access instruction is executed in the first simulation, and a first memory region that is included in the main memory and used by the first core in the first simulation does not match a second memory region that is included in the main memory and used by the accelerator in the accelerator simulation, the first and accelerator simulations are not synchronized.

5. The device according to claim 1, the process further including:

synchronizing, when the second access instruction is executed in the second simulation, the first simulation with the second simulation; and correcting, by executing the third simulation to simulate the third operation of the cache memory when the second core accesses the main memory through the cache memory in accordance with the second access instruction, the second performance value calculated after the synchronizing when the second access instruction is executed in the second simulation.

6. The device according to claim 5, wherein when a first time of the second simulation is after a second time of the first simulation, the first and second simulations are not synchronized.

7. The device according to claim 5, the process further comprising:

determining, when the second access instruction is executed in the second simulation, whether a first memory region that is included in the main memory and used by the first core in the first simulation matches a second memory region that is included in the main memory and used by the second core in the second simulation; and determining, if the first and second memory regions do not match, the first and second simulations are not synchronized.

8. The device according to claim 1, wherein if a first time of the first simulation is after a second time of the accelerator simulation, the synchronizing of the first and second simulations is not performed.

9. A method performed by a computer for determining performance of a multicore processor having first and second cores able to access a same main memory through a same cache memory, the method comprising:

modeling the multicore processor, including the cache memory;

obtaining a first performance value of a first code executed by the first core and including a first access instruction to access the main memory, by executing a first simulation to simulate a first operation when the first core executes the first code;

obtaining, after the obtaining of the first performance value, a second performance value of a second code executed by the second core and including a second access instruction to access the main memory, by executing a second simulation to simulate a second operation when the second core executes the second code;

synchronizing the first simulation with the second simulation when the first access instruction is executed in the first simulation;

correcting, by executing a third simulation to simulate a third operation of the cache memory when the first core accesses the main memory through the cache memory in accordance with the first access instruction, the first performance value calculated after synchronization by the synchronizing, and determining, when the first access instruction is executed in the first simulation, whether a first memory region that is included in the main memory and used by the first core in the first simulation matches a second memory region that is included in the main memory and used by the second core in the second simulation, and when the first and second memory regions do not match, the synchronizing is not performed.

10. A non-transitory computer-readable medium storing a program for causing a computer to execute a process for determining performance of a multicore processor having first and second cores able to access a same main memory through a same cache memory, the process comprising:

modeling the multicore processor, including the cache memory;

obtaining a first performance value of a first code executed by the first core and including a first access instruction to access the main memory, by executing a first simulation to simulate a first operation when the first core executes the first code;

obtaining, after the obtaining of the first performance value, a second performance value of a second code executed by the second core and including a second access instruction to access the main memory, by executing a second simulation to simulate a second operation when the second core executes the second code;

synchronizing the first simulation with the second simulation when the first access instruction is executed in the first simulation;

correcting, by executing a third simulation to simulate a third operation of the cache memory when the first core accesses the main memory through the cache memory in accordance with the first access instruction, the first performance value calculated after synchronization by the synchronizing, and determining, when the first access instruction is executed in the first simulation, whether a first memory region that is included in the main memory and used by the first core in the first simulation matches a second memory region that is included in the main memory and used by the second core in the second simulation, and when the first and second memory regions do not match, the synchronizing is not performed.

* * * * *